(12) United States Patent
Chu et al.

(10) Patent No.: US 11,763,902 B2
(45) Date of Patent: *Sep. 19, 2023

(54) MEMORY DEVICE AND MULTI-PASS PROGRAM OPERATION THEREOF

(71) Applicant: YANGTZE MEMORY TECHNOLOGIES CO., LTD., Wuhan (CN)

(72) Inventors: Ling Chu, Wuhan (CN); Lu Qiu, Wuhan (CN); Yue Sheng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 84 days.

This patent is subject to a terminal disclaimer.

(21) Appl. No.: 17/483,265

(22) Filed: Sep. 23, 2021

(65) Prior Publication Data

US 2022/0415418 A1 Dec. 29, 2022

Related U.S. Application Data

(63) Continuation of application No. PCT/CN2021/102298, filed on Jun. 25, 2021.

(51) Int. Cl.
*G11C 7/00* (2006.01)
*G11C 16/34* (2006.01)
(Continued)

(52) U.S. Cl.
CPC .......... *G11C 16/3459* (2013.01); *G11C 16/08* (2013.01); *G11C 16/102* (2013.01); *G11C 16/26* (2013.01)

(58) Field of Classification Search
CPC ....... G11C 7/1078; G11C 7/22; G11C 7/1072; G11C 7/1006; G11C 7/1066
(Continued)

(56) References Cited

U.S. PATENT DOCUMENTS

2008/0123425 A1* 5/2008 Lutze ................. G11C 16/3418
365/185.17
2010/0061151 A1 3/2010 Miwa et al.
(Continued)

FOREIGN PATENT DOCUMENTS

CN 106157999 A 11/2016
CN 109427400 A 3/2019
(Continued)

OTHER PUBLICATIONS

International Search Report issued in corresponding International Application No. PCT/CN2021/102298, dated Feb. 18, 2022, 4 pages.

*Primary Examiner* — Son T Dinh
(74) *Attorney, Agent, or Firm* — Bayes PLLC

(57) ABSTRACT

In certain aspects, a memory device includes a memory cell array having rows of memory cells, word lines respectively coupled to the rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells, such that each target memory cell is programmed into one of K intermediate levels based on the corresponding piece of N-bits data, wherein $2^{N-1} < K < 2^N$. The peripheral circuit is also configured to program, in a second pass after the first pass, the row of target memory cells, such that each target memory cell is programmed into one of the $2^N$ levels based on the corresponding piece of N-bits data.

20 Claims, 20 Drawing Sheets

(51) Int. Cl.
*G11C 16/08* (2006.01)
*G11C 16/10* (2006.01)
*G11C 16/26* (2006.01)

(58) Field of Classification Search
USPC .................................... 365/189.16, 189.14
See application file for complete search history.

(56) References Cited

U.S. PATENT DOCUMENTS

| | | | |
|---|---|---|---|
| 2010/0128523 | A1 | 5/2010 | Yip |
| 2013/0155769 | A1 | 6/2013 | Li et al. |
| 2018/0090209 | A1 | 3/2018 | Hong et al. |
| 2020/0234759 | A1 | 7/2020 | Liang et al. |
| 2022/0319617 | A1* | 10/2022 | Zhang ................ G11C 16/3459 |

FOREIGN PATENT DOCUMENTS

| | | |
|---|---|---|
| CN | 109863557 A | 6/2019 |
| CN | 110546762 A | 12/2019 |
| CN | 110619916 A | 12/2019 |
| CN | 111527549 A | 8/2020 |

\* cited by examiner

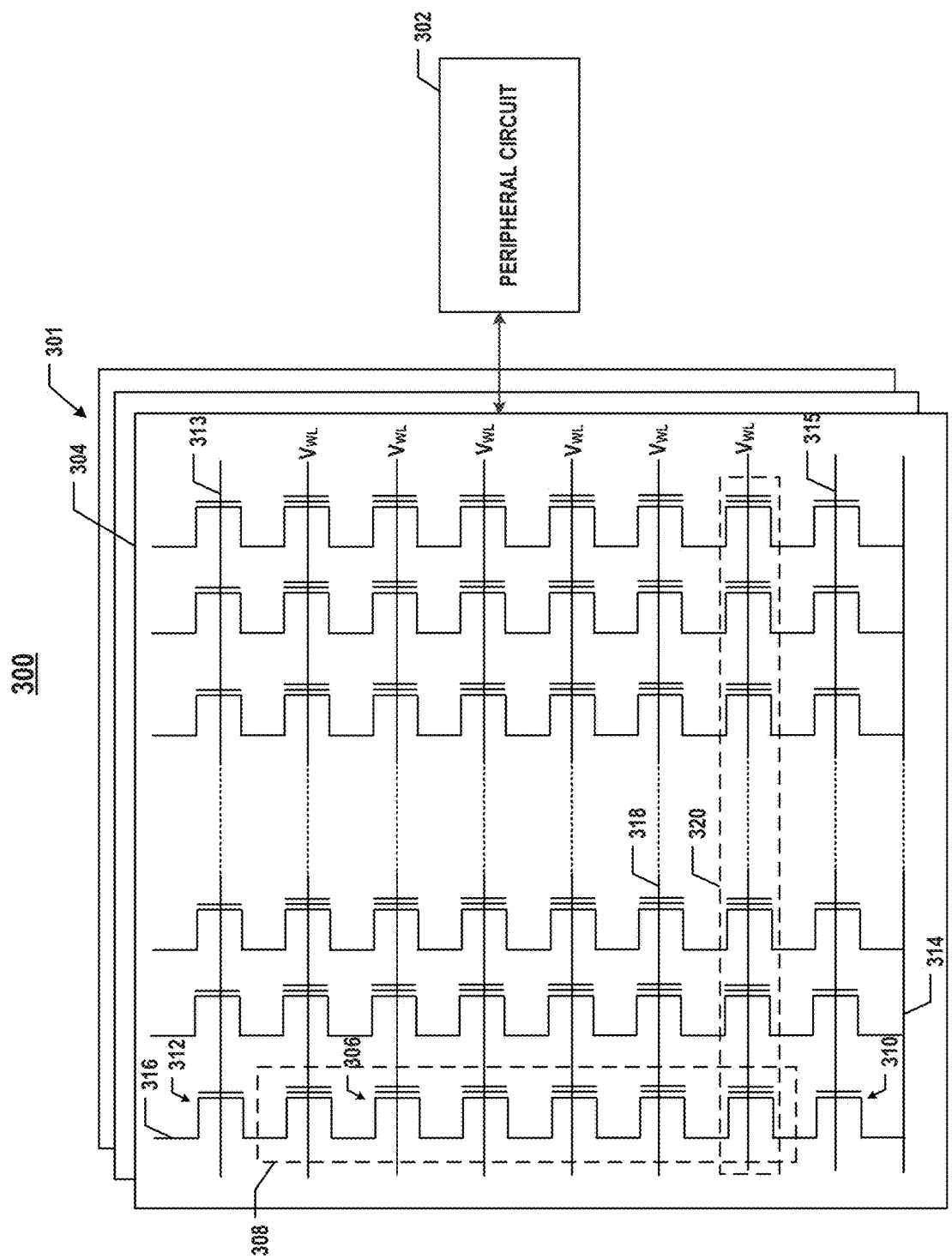

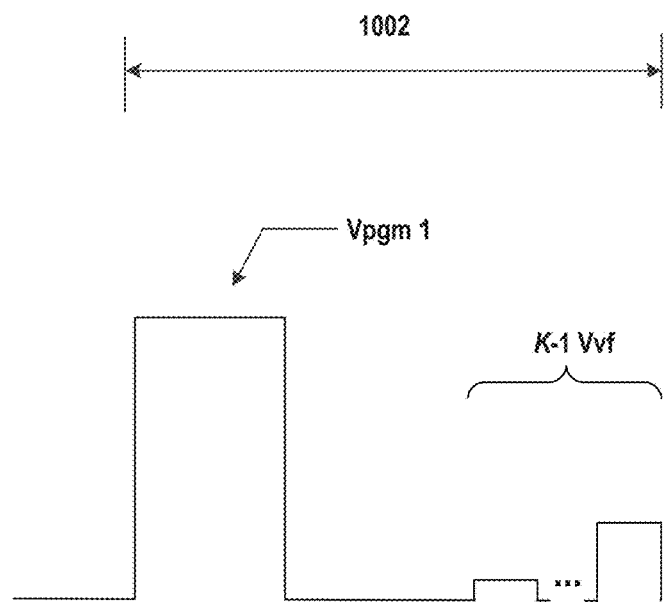
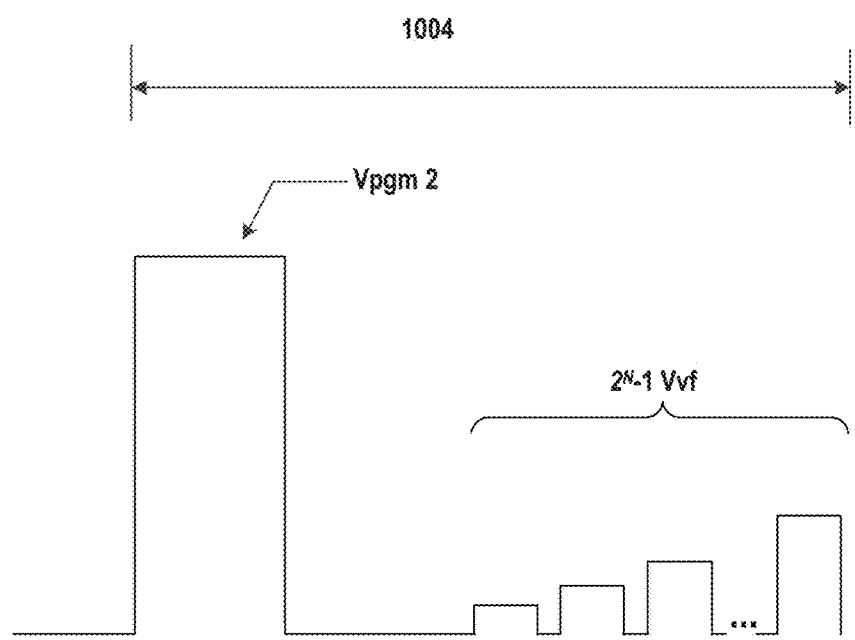
FIG. 10

MEMORY DEVICE AND MULTI-PASS PROGRAM OPERATION THEREOF

CROSS-REFERENCE TO RELATED APPLICATIONS

This application is continuation of International Application No. PCT/CN2021/102298, filed on Jun. 25, 2021, entitled "MEMORY DEVICE AND MULTI-PASS PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1}<K<2^N$. The peripheral circuit is also configured to program, in a second pass after the first pass, the row of targe memory cells, such that each target memory cell is programmed into one of the $2^N$ levels based on the corresponding piece of N-bits data to be stored in the target memory cell.

In another aspect, a system includes a memory device configured to store data and a memory controller coupled to the memory device. The memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1}<K<2^N$. The peripheral circuit is also configured to program, in a second pass after the first pass, the row of targe memory cells, such that each target memory cell is programmed into one of the $2^N$ levels based on the corresponding piece of N-bits data to be stored in the target memory cell. The memory controller is configured to transmit the corresponding piece of N-bits data to the peripheral circuit prior to the first pass, store N−M bits of the corresponding piece of N-bits data after the first pass, where M is an integer smaller than N, and transmit the stored N−M bits of the corresponding piece of N-bits data to the peripheral circuit prior to the second pass.

In still another aspect, a method for operating a memory device is provided. The memory device includes a memory cell array having a plurality of rows of memory cells, and a plurality of word lines respectively coupled to the plurality rows of memory cells. In a first pass, a row of target memory cells of the plurality of rows of memory cells is programmed, such that each of the row of target memory cells is programmed into one of K intermediate levels based on one of $2^N$ pieces of N-bits data to be stored in the target memory cell, where N is an integer greater than 1, wherein $2^{N-1}<K<2^N$. In a second pass after the first pass, the row of targe memory cells is programmed, such that each target memory cell is programmed into one of $2^N$ levels based on the corresponding piece of N-bits data to be stored in the target memory cell. The $2^N$ levels correspond to the $2^N$ pieces of N-bits data.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 3 illustrates a schematic diagram of an exemplary memory device including peripheral circuits, according to some aspects of the present disclosure.

FIG. 10 illustrates an exemplary waveform of word line voltages applied to a selected word line in a multi-pass program operation, according to some aspects of the present disclosure.

Figure 1:
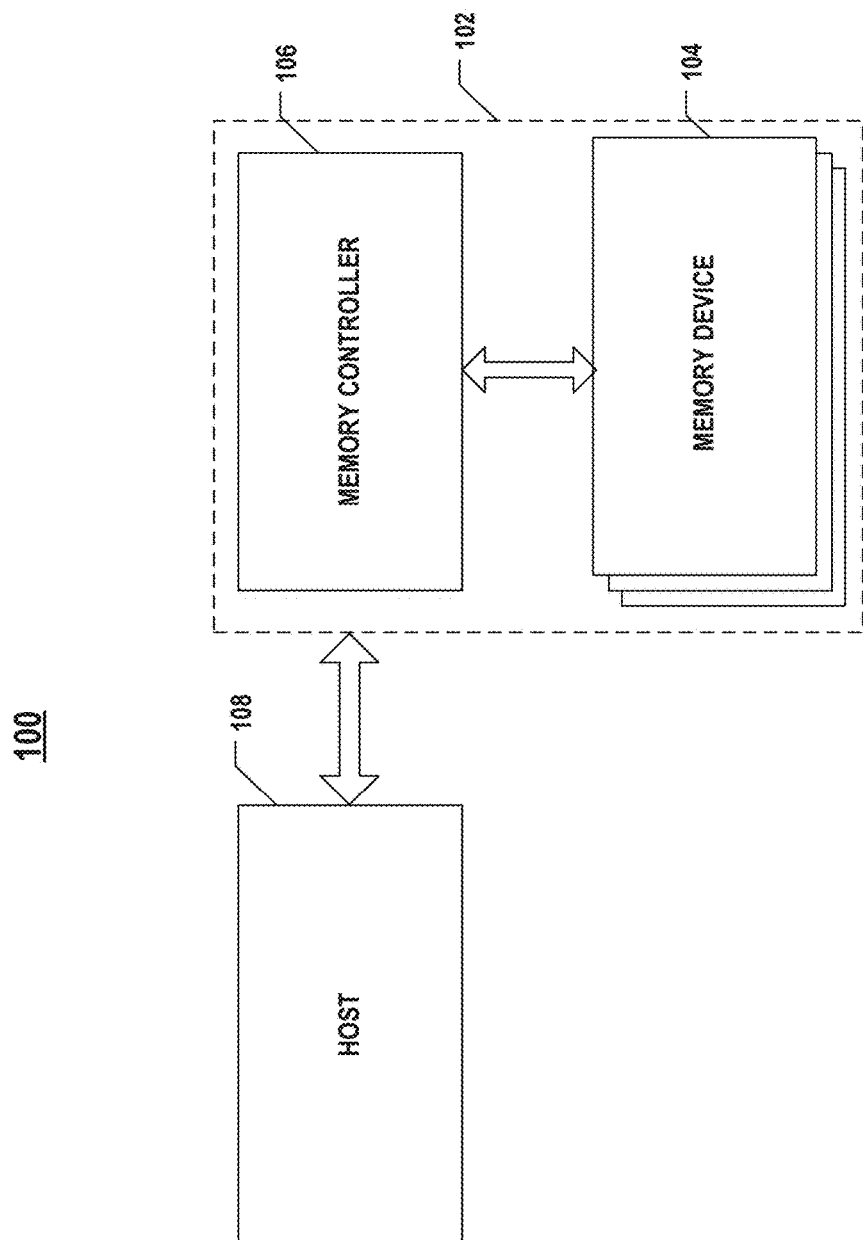
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosure can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell in multiple levels (a.k.a., states) in order to increase the storage capacity and reduce the cost per bit. In program operations, the data may be programmed (written) into xLCs, such as multi-level cells (MLCs), trip-level cells (TLCs), quad-level cells (QLCs), etc. For xLCs, for example, QLCs, multi-pass program operations can be used to reduce program time and increase read margin, which involve a coarse program pass that programs the xLCs to one of the intermediate levels, as well as a fine program pass that programs the xLCs from the intermediate levels to the final levels. For example, for QLCs, there are two schemes of two-pass program operations: an 8-16 scheme in which the memory cells are first programmed to 8 levels in the coarse programming, and then programmed to 16 levels in the fine programming; and a 16-16 scheme in which the memory cells are first programmed to 16 levels in the coarse programming, and then reprogrammed to form 16 levels with smaller threshold voltage ranges in the fine programming.

The 16-16 scheme typically has a smaller fail bit count (FBC), larger read margin and shorter read time, compared with the 8-16 scheme. However, the 16-16 scheme requires the memory controller to temporarily store a larger amount of data than the 8-16 scheme, which is undesirable from the memory controller's perspective. Specifically, first, in order to reduce the data storage loading of the memory controller, the data written for the first program pass (e.g., the coarse program pass) should be read out effectively, and less threshold voltage levels are easier to achieve effective read operations. Second, in the case of the same threshold voltage levels, to get as smaller FBC as possible, the number of read levels per page should be the same as possible. The 8-16 scheme satisfies the first condition, but does not satisfy the second condition; conversely, the 16-16 scheme satisfies the second condition, but fails to meet the first condition. The same issues may occur in any $2^{N-1}$-$2^N$ schemes and $2^N$-$2^N$ schemes for xLCs, where N represents the number of bits of the data stored in each memory cell (e.g., N=4, the 8-18 scheme and 16-16 scheme for QLCs).

To address one or more of the aforementioned issues, the present disclosure introduces a solution that balances the pros and cons of the $2^{N-1}$-$2^N$ scheme and the $2^N$-$2^N$ scheme used for program operations. Compared with the existing $2^N$-$2^N$ schemes, the number of intermediate levels in a non-last program pass (i.e., a coarse program pass) can be reduced to allow at least part of the data used in the non-last program pass to be read in a later program pass, thereby reducing the amount of data that needs to be cached and re-transmitted in the later program pass (e.g., a fine program pass) by the memory controller, thereby reducing the loading of the memory controller. On the other hand, by programming the memory cells in the non-last pass based on N pages of data, as opposed to N−1 pages of data in the existing $2^{N-1}$-$2^N$ schemes, the number of read levels per page becomes more balanced, such that the FBC can be reduced compared with the existing $2^{N-1}$-$2^N$ schemes.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a three-dimensional (3D) NAND Flash memory device, can perform multi-pass program operations in which some of the intermediate levels in the coarse program pass are combined to enlarge the read margins for valid data reading afterward without sacrificing the FBCs too much. Consistent with the scope of the present disclosure, in some implementations, in a multi-pass program operation, the number K of the intermediate levels in a non-last pass (e.g., a coarse program pass) is smaller than $2^N$, but larger than $2^{N-1}$, where N is the number of bits in each memory cell (xLC).

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

As described below in detail, in program operations, memory controller 106 can be configured to transmit data to be programmed to memory device 104 in a manner according to the multi-pass program operations disclosed herein. Consistent with the scope of the present disclosure, in some implementations, memory controller 106 transmits all the pages of data to memory device 104 for the coarse program pass and stores only some of the pages of data after the coarse program pass to reduce the loading. Memory controller 106 thus only needs to re-transmit the stored pages of data, instead of all the pages of data, to memory device 104 for the fine program pass, according to some implementations.

Figure 2A:
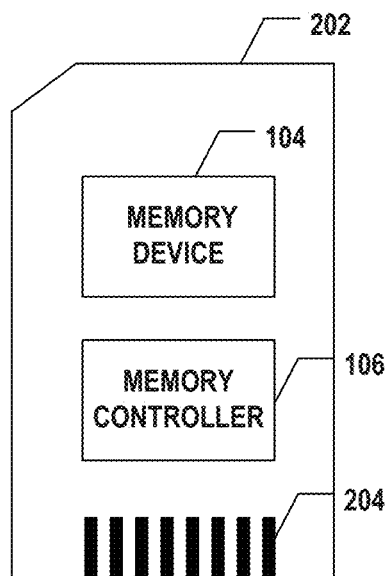
FIG. 2A illustrates a diagram of an exemplary memory card having a memory device, according to some aspects of the present disclosure.
Figure 2B:
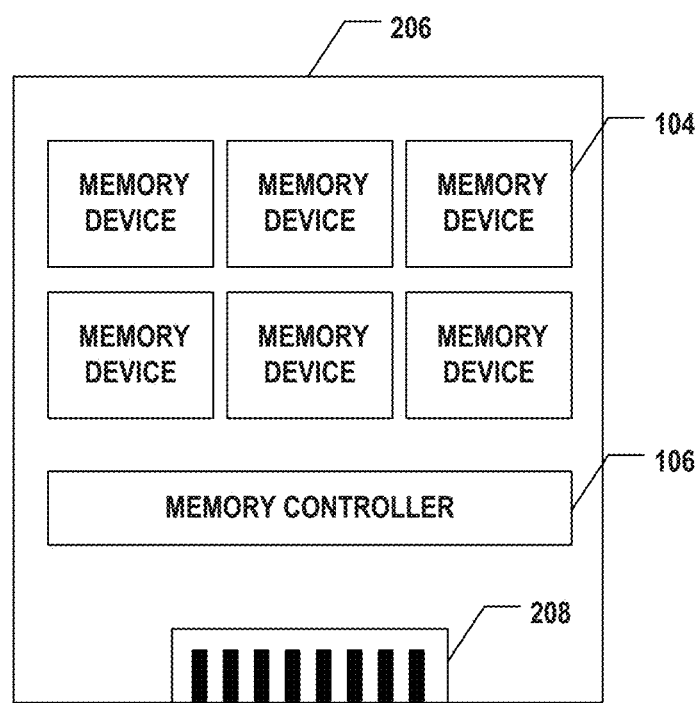
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling card 202 with a host (e.g., host 108 in FIG. 1). In some implementations, the storage capacity and/or the operation speed of card 202 is greater than those of memory card 202.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 306 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., $2^N$ pieces of N-bits data, e.g., gray codes). In one example, the MLC can be programmed to assume one of three possible programming levels (e.g., 01, 10, and 11) from an erased state by writing one of three possible nominal storage values to the cell. A fourth nominal storage value can be used for the erased state (e.g., 00).

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for read and program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

As shown in FIG. 3, memory cell array 301 can include an array of memory cells 306 in a plurality of rows and a plurality of columns in each block 304. One row of memory cells 306 corresponds to one or more pages 320, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 4A:
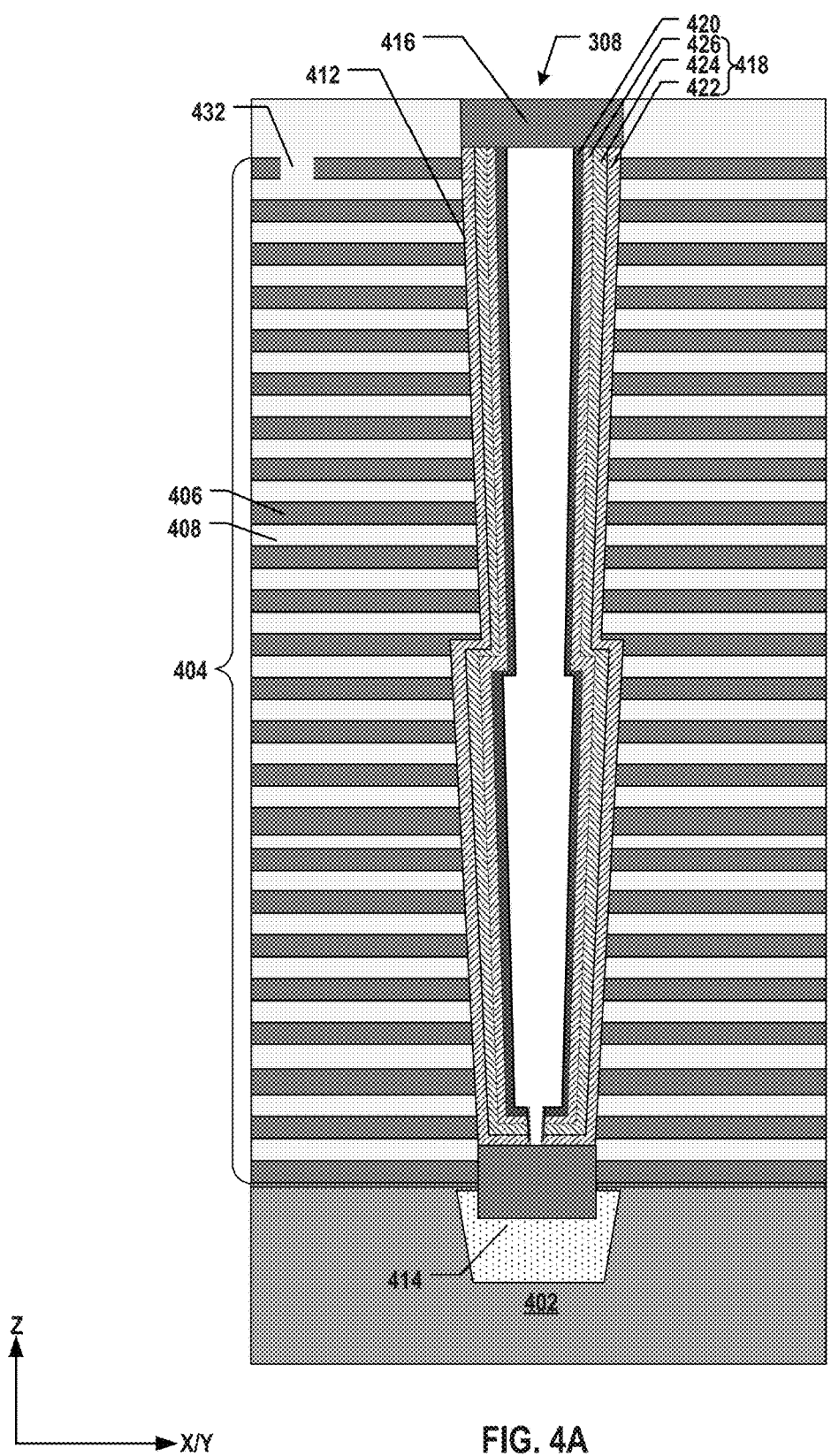
FIGS. 4A and 4B illustrate a side view and a plan view of cross-sections of a memory cell array including a NAND memory string, respectively, according to some aspects of the present disclosure.
Figure 4B:
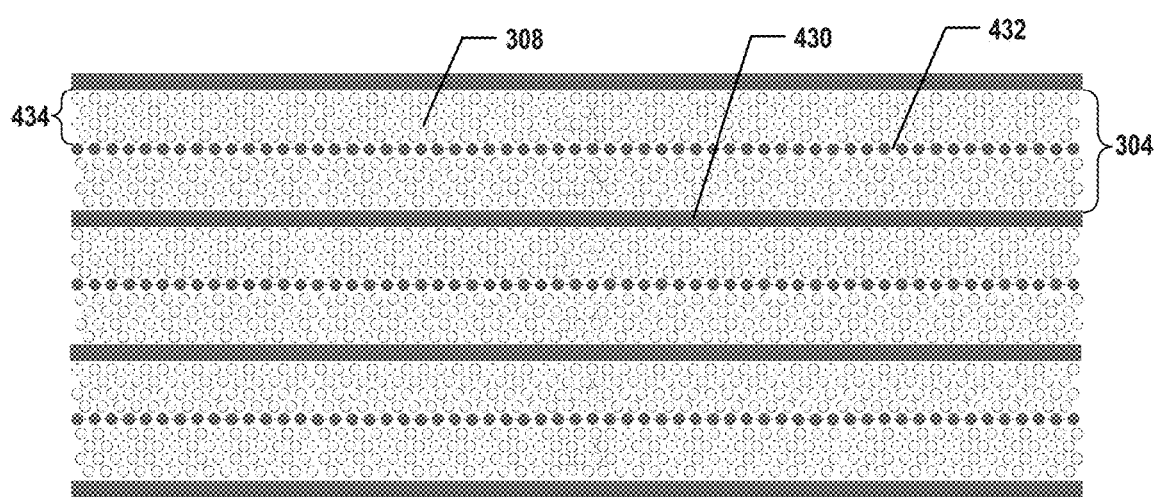

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4A, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4A, additional components of memory cell array 301 can be formed including, but not limited to, gate line slits/source contacts, local contacts, interconnect layers, etc.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas (e.g., fingers 434) by DSG cuts 432 (shown in FIG. 4A as well), which electrically separate DSG lines 313 between adjacent fingers 434, such that DSG lines 313 in different fingers 434 may be individually controlled in read and program operations.

Figure 5A:
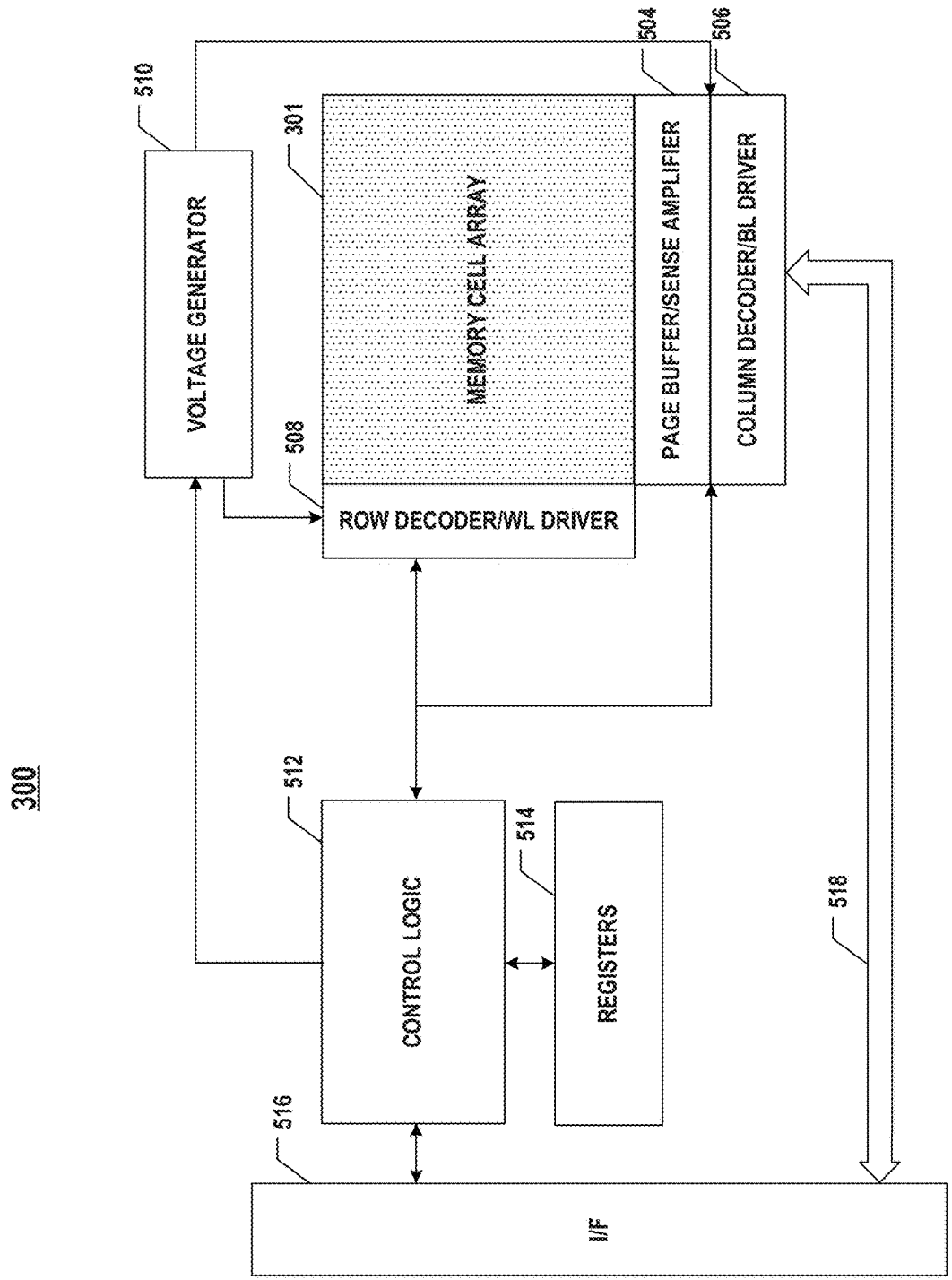
FIG. 5A illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5A illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits that are not shown in FIG. 5A may be included as well.

Page buffer/sense amplifier 504 can be configured to read and program (write) data from and to memory cell array 301 according to the control signals from control logic 512. In one example, page buffer/sense amplifier 504 may store one or more pages of program data (write data) to be programmed into a target row of memory cell array 301. In another example, page buffer/sense amplifier 504 may verify programmed target memory cells 306 in each program/verify loop (cycle) in a program operation to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation.

As described below in detail and consistent with the scope of the present disclosure, in program operations, page buffer/sense amplifier 504 can include storage modules (e.g., latches) for temporarily storing a piece of N-bits data (e.g., in the form of gray codes) received from data bus 518 and providing the piece of N-bits data to a corresponding target memory cell 306 through the corresponding bit line 316 in a first pass (a non-last program pass, e.g., a coarse program pass) of a multi-pass program operation. Prior to a second pass after the first pass (the last program pass, e.g., a fine program pass), in a read operation, page buffer/sense amplifier 504 can be configured to read one or more (M) bits of the piece of N-bits data based on the corresponding intermediate level in which target memory cell 306 is programmed into the first pass and also receive the remaining (N−M) bits of the piece of N-bits data from memory controller (e.g., 106 in FIG. 1). Page buffer/sense amplifier 504 can then be configured to combine the read bits and the received bits into the corresponding piece of N-bits data and provide the corresponding piece of N-bits data to target memory cell 306 through the corresponding bit line 316 in the second first pass.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301.

As part of peripheral circuits 302, control logic 512 can be coupled to other peripheral circuits described above and configured to control the operations of other peripheral circuits. Registers 514 can be coupled to control logic 512 and include status registers, command registers, and address registers for storing status information, command operation codes (OP codes), and command addresses for controlling the operations of each peripheral circuit. Interface (I/F) 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

Figure 5B:
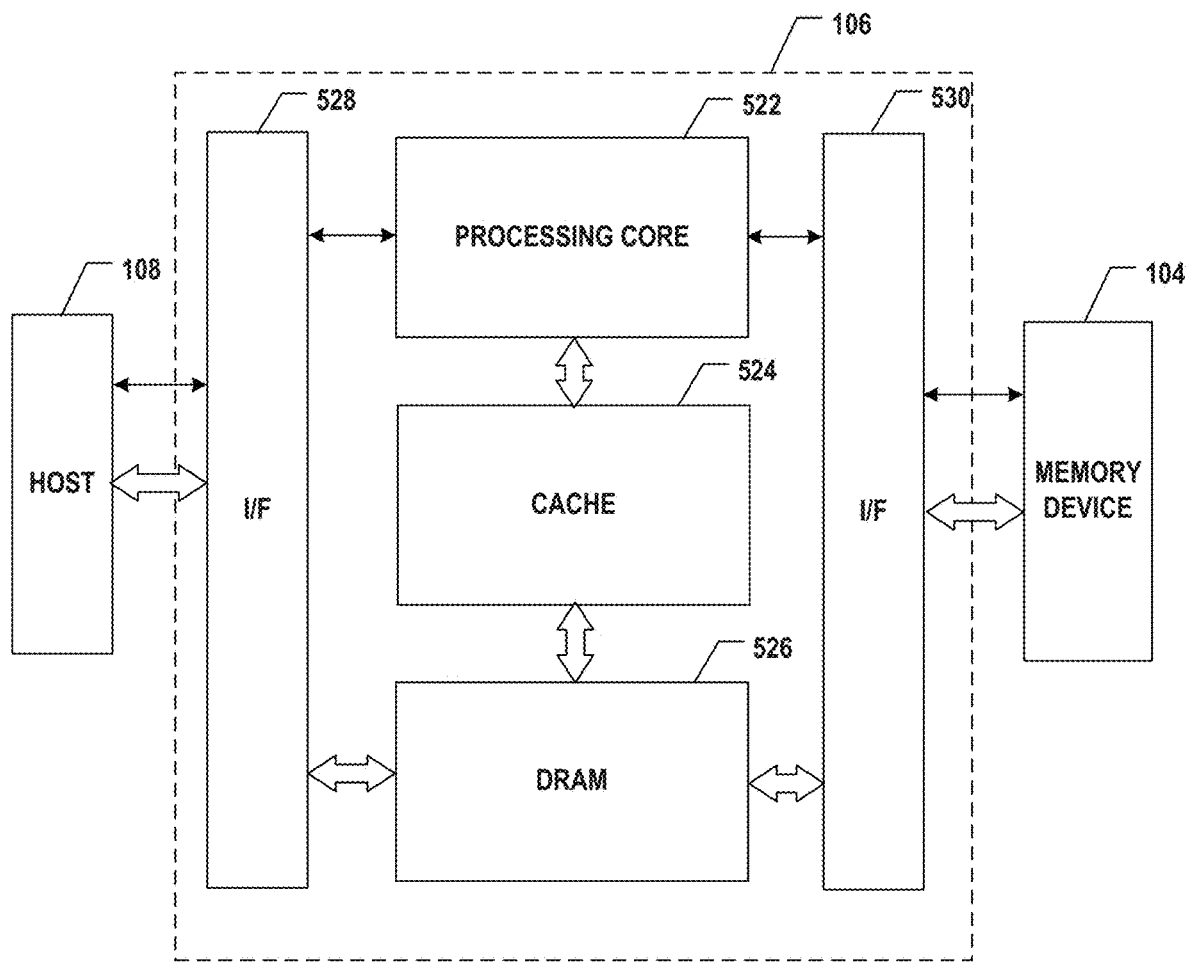
FIG. 5B illustrates a block diagram of an exemplary memory controller, according to some aspects of the present disclosure.

FIG. 5B illustrates a block diagram of exemplary memory controller 106, according to some aspects of the present disclosure. Memory controller 106 can include one or more processing cores 522 and storage modules including cache 524 and dynamic random-access memory (DRAM) 526. Memory controller 106 can also include an interface (I/F) 528 (also named as "front-end interface") with host 108 and an interface (I/F) 530 (also named as "back-end interface") with memory device 104. Processing core 522 can include arithmetic logic units (ALUs) for performing arithmetic and logic operations. DRAM 526 can store instructions to be loaded into processing core 522 and executed by processing core 522 to perform the functions of memory controller 106. Interface 528 can receive instructions and data from host 108 and buffer and replay the instructions and data to processing core 522 and DRAM 526, respectively. Interface 530 can transmit control signals and data from processing core 522 and DRAM 526, respectively, to memory device 104.

Different from the existing $2^{N-1}$-$2^N$ schemes (e.g., the 8-16 scheme), in some implementations, according to the multi-pass program schemes disclosed herein, memory controller 106 is configured to transmit the entire N pages of data (including the entire piece of N-bits data for each target memory cell 306), as opposed to N−1 pages of data, to memory device 104 through interface 530 prior to the first pass (a non-last program pass, e.g., a coarse program pass). Different from the existing $2^N$-$2^N$ schemes (e.g., the 16-16 scheme), in some implementations, according to the multi-pass program schemes disclosed herein, memory controller 106 is also configured to, after the first pass, store N−M pages of data (including N−M bits of the piece of N-bits data for each target memory cell 306), as opposed to the entire N pages of data. M is an integer smaller than N. For example, memory controller 106 may store the N−M pages of data in cache 524 and or DRAM 526. Different from the existing $2^N$-$2^N$ schemes, in some implementations, according to the multi-pass program schemes disclosed herein, memory controller 106 is further configured to transmit the stored N−M pages of data (including N−M bits of the piece of N-bits data for each target memory cell 306), as opposed to the entire N pages of data, prior to the second pass (the last program pass, e.g., a fine program pass). As a result, the amount of data that needs to be cached by memory controller 106 between the first and second passes can be reduced by M pages compared with the existing $2^N$-$2^N$ schemes, thereby reducing the loading of memory controller 106.

Figure 6:
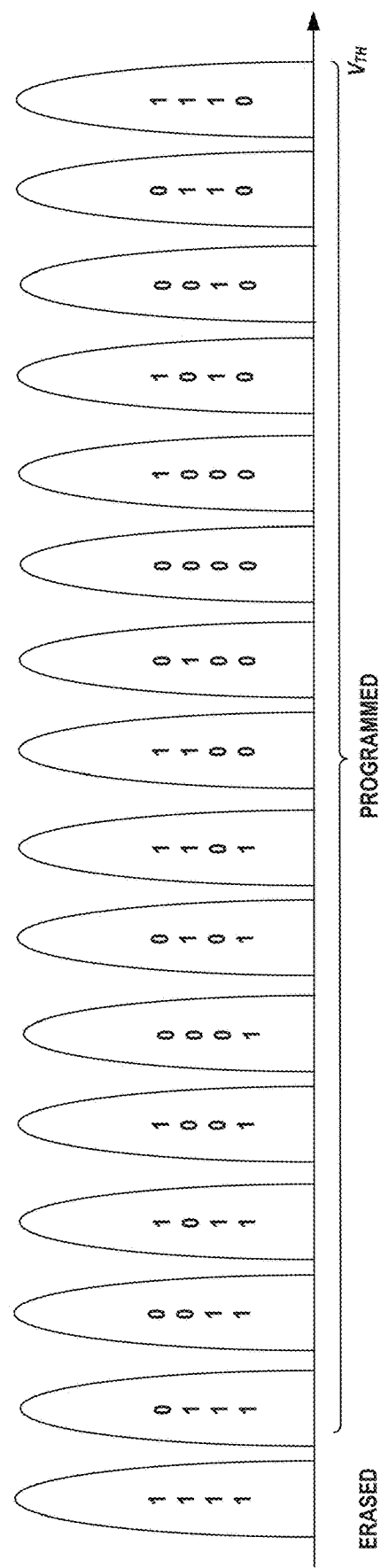
FIG. 6 illustrates exemplary threshold voltage distributions of memory cells in a program operation, according to some aspects of the present disclosure.

FIG. 6 illustrates exemplary threshold voltage distributions of memory cells in a program operation, according to some aspects of the present disclosure. As described above, each memory cell 306 can be configured to store a piece of N-bits data in one of $2^N$ levels, where N is an integer greater than 1 (e.g., N=2 for MLCs, N=3 for TLCs, N=4 for QLCs, etc.). Each level can correspond to one of $2^N$ threshold voltage (Vth) ranges of memory cells 306. Considering a multi-pass program operation in which memory cell 306 may be programmed into an intermediate level first in a coarse program pass (a non-last program pass), the "level" referred to herein may be considered as the final level after the fine program pass (the last program pass) of the multi-pass program operations, in contrast to the intermediate level. Taking QLCs, where N=4, for example, as shown in FIG. 6, memory cell 306 may be programmed into one of the 16 levels, including one level of the erased state and 15 levels of the programmed states. Each level may correspond to a respective threshold voltage (Vth) range of memory cells 306. For example, the level corresponding to the lowest threshold voltage range (the left-most threshold voltage distribution in FIG. 6) may be considered as level 0, the level corresponding to the second-lowest threshold voltage range (the second left-most threshold voltage distribution in FIG. 6) may be considered as level 1, and so until level 15 corresponding to the highest threshold voltage range (the right-most threshold voltage distribution in FIG. 6).

On the other hand, each level can correspond to one of the $2^N$ pieces of N-bits data that is to be stored in target memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, TABLE 1 below shows an example of a binary code representing a one-to-one mapping between 16 levels (Lvl 0 to Lvl 15) and 16 pieces of 4-bits data used in the example of FIG. 6. As shown in TABLE 1, each piece of 4-bits data may consist of four bits of binary values (b1, b2, b3, and b4). In one example, level 1 may correspond to a piece of 4-bits data having a value of 1111. In another example, level 15 may correspond to another piece of 4-bits data having a value of 1110.

Each storage module 702 may include i storage units 704 (e.g., latches) corresponding to i target memory cells 306 in a row of memory cells 306 coupled to a selected word line 318 in a program operation. That is, each target memory cell 306 may be coupled to a corresponding set of four storage units 704 from each of four storage modules 702 (P1, P2, P3, and P4) through a respective bit line 316 (BL_1, BL_2, ..., BL_i–1, or BL_i). For each target memory cell 306 in a program operation, the 4 bits of binary values in the corresponding piece of 4-bits data (e.g., b1, b2, b3, and b4 according to the gray code in TABLE 1) may be temporarily stored in the corresponding set of four storage units 704, respectively, such that the corresponding piece of 4-bits data may be provided to target memory cell 306 by page buffer/sense amplifier 504. The functions and operations of page buffer/sense amplifier 504 according to the multi-pass program schemes disclosed herein are described below in detail.

Figure 8A:
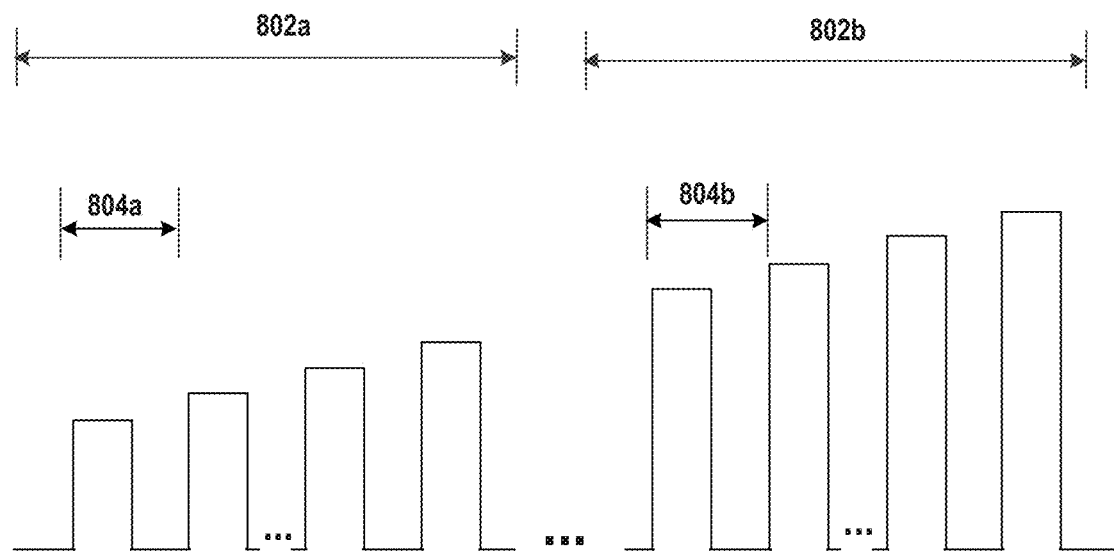
FIGS. 8A and 8B illustrate a waveform of word line voltages applied to a selected word line in a multi-pass program operation.
Figure 8B:
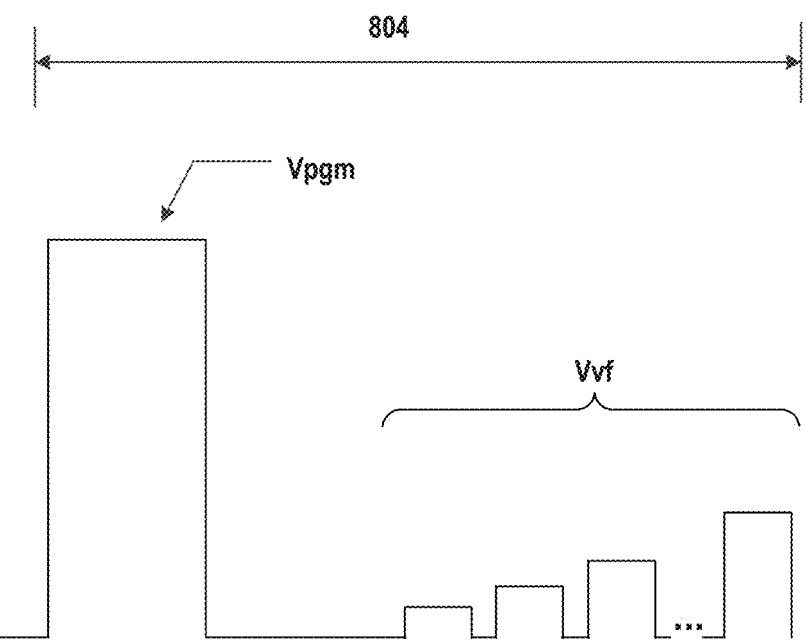

To perform a program operation, in addition to page buffer/sense amplifier 504 providing to each target memory cell 306 the corresponding piece of N-bits data, row decoder/word line driver 508 can be configured to apply program voltages and verify voltages to a selected word line 318 coupled to a row of target memory cells 306 in one or more program/verify loops in order to raise the threshold voltage of each target memory cell 306 to a desired level (into a desired range of threshold voltages) based on the corresponding piece of N-bits data. For example, FIGS. 8A and 8B illustrate a waveform of word line voltages applied to a selected word line in a multi-pass program operation. As shown in FIG. 8A, the multi-pass program operation includes at least a first pass 802a (a.k.a., a coarse program pass, e.g., a non-last program pass) and a second pass 802b (a.k.a., a fine program pass, e.g., the last program pass) after first pass 802a. First pass 802a includes one or more program/verify loops 804a, and second pass 802b includes one or more program/verify loops 804b as well.

As shown in FIG. 8B, in each program/verify loop 804, regardless of whether it is in first pass 802a or second pass 802b, a program voltage (Vpgm) is applied to the selected word line, followed by a number of verify voltages (Vvf) with incremental changes of voltage levels. For $2^N$-$2^N$ schemes, the number of verify voltages in each program/verify loop 804 in first pass 802a is the same as that in

TABLE 1

| Lvl | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| b1 | 1 | 0 | 0 | 0 | 1 | 1 | 0 | 0 | 0 | 0 | 0 | 1 | 1 | 1 | 1 | 1 |
| b2 | 1 | 1 | 1 | 0 | 0 | 0 | 0 | 1 | 1 | 0 | 0 | 0 | 0 | 1 | 1 | 1 |
| b3 | 1 | 1 | 1 | 1 | 1 | 0 | 0 | 0 | 0 | 0 | 1 | 1 | 0 | 0 | 0 | 1 |
| b4 | 1 | 1 | 0 | 0 | 0 | 0 | 0 | 0 | 1 | 1 | 1 | 1 | 1 | 1 | 0 | 0 |

Figure 7A:
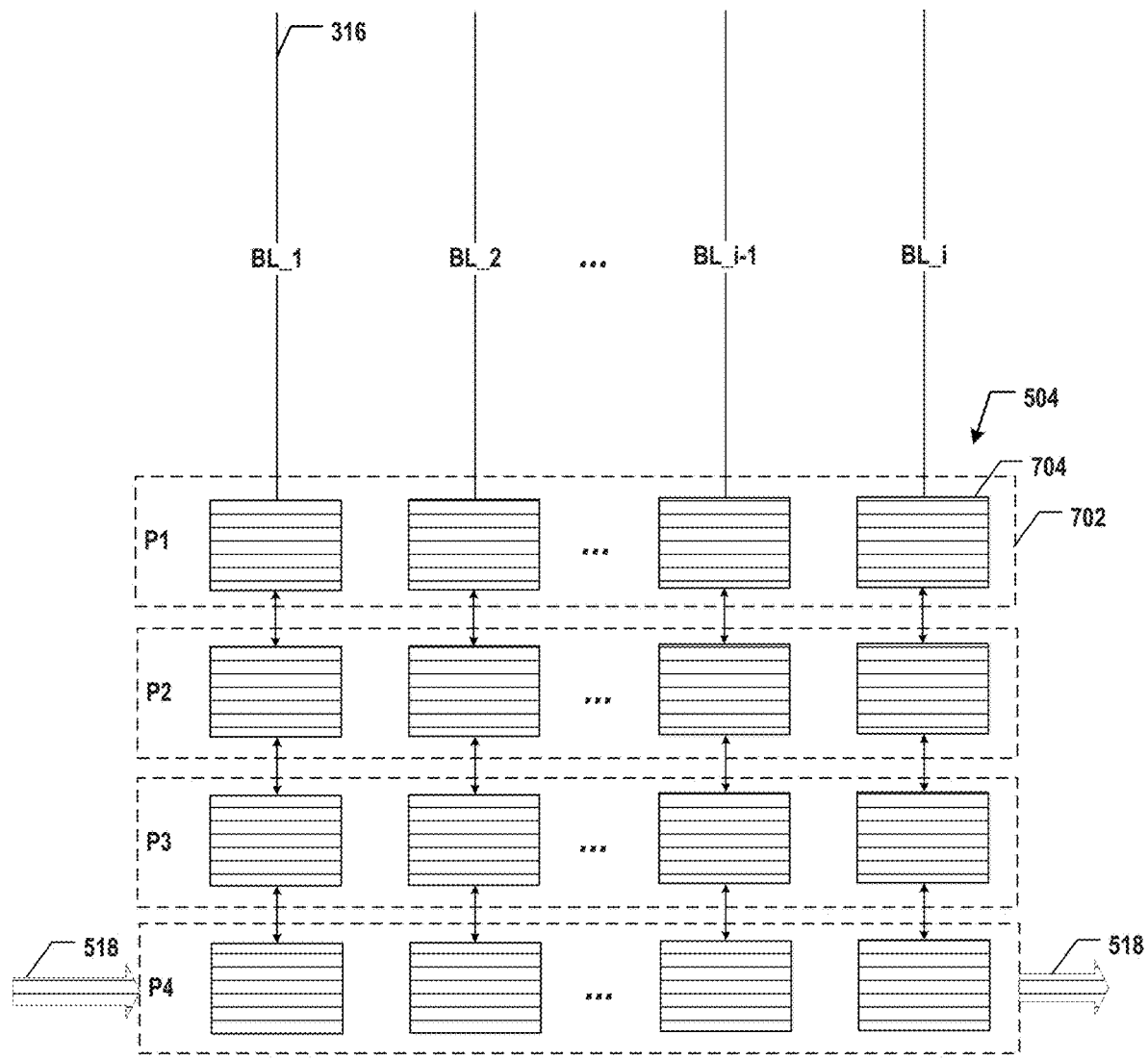
FIGS. 7A and 7B illustrate a block diagram of an exemplary page buffer in a program operation, according to some aspects of the present disclosure.
Figure 7B:
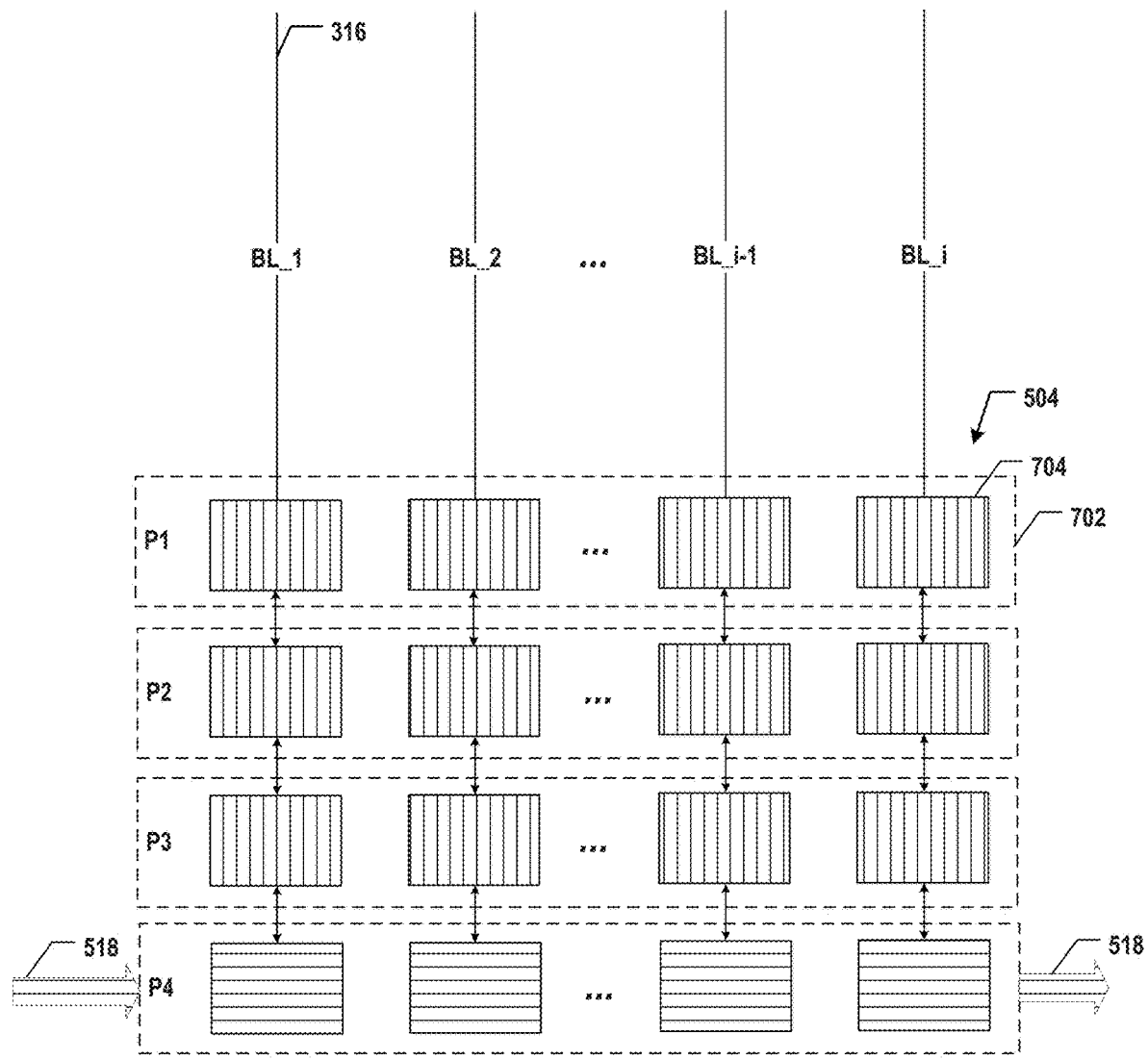

FIGS. 7A and 7B illustrate a block diagram of exemplary page buffer/sense amplifier 504 in a program operation, according to some aspects of the present disclosure. In some implementations, page buffer/sense amplifier 504 includes N storage modules (e.g., latches) each configured to temporarily store one of N pages of data. That is, the N-bits data (having $2^N$ values) to be stored by a row of target memory cells 306 coupled to a selected word line 318 can be transmitted, stored, and provided in the form of N pages of N-bits data in a program operation.

Figure 9A:
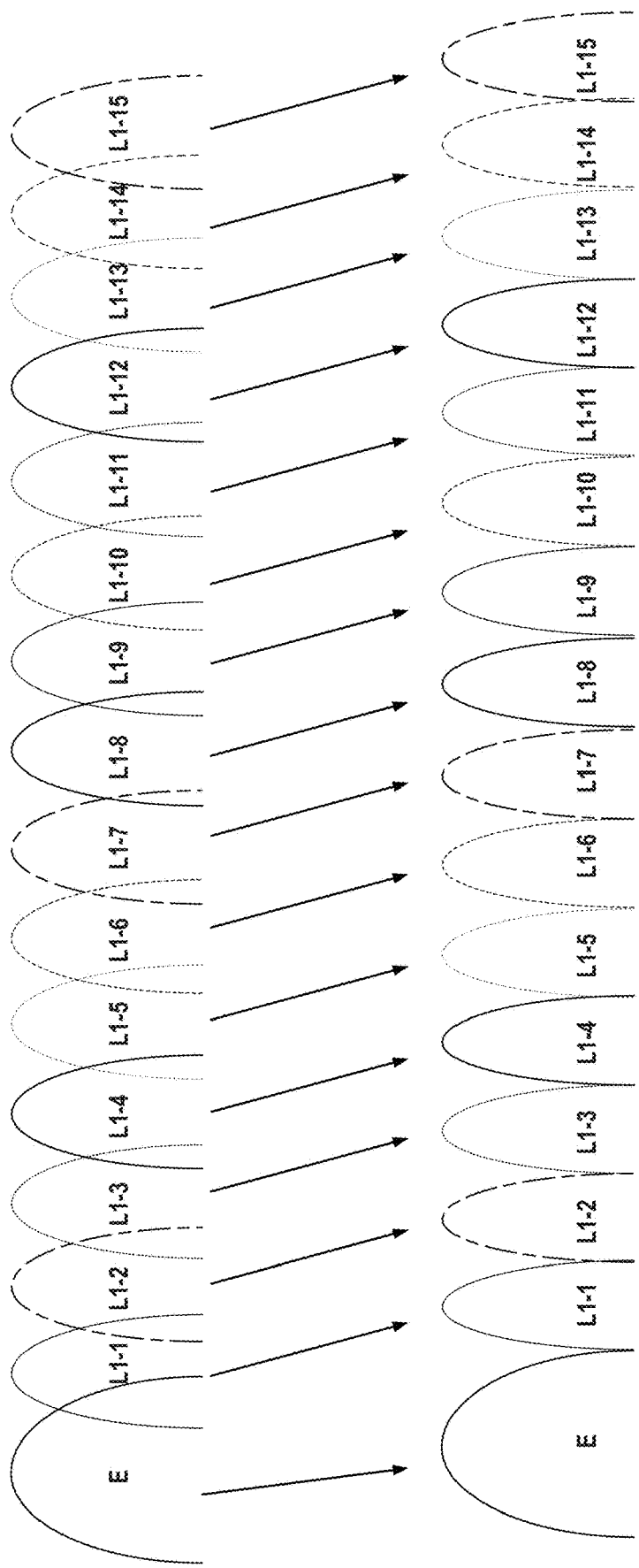
FIG. 9A illustrates threshold voltage distributions of memory cells in a multi-pass program operation.

Taking QLCs, where N=4, for example, as shown in FIGS. 7A and 7B, page buffer/sense amplifier 504 may include 4 storage modules 702 (P1, P2, P3, and P4) each configured to temporarily store one of 4 pages of 4-bits data.

second pass 802b, i.e., $2^N$–1, in order to verify all $2^N$ possible intermediate levels corresponding to 2 possible values of the N-bits data. Still taking QLCs, where N=4, for example, as shown in FIG. 9A, the target memory cells are first programmed into one of 16 intermediate levels (E, L1-1, L1-2, L1-3, ..., L1-15) in first pass 802a by applying 15 verify voltages each between two adjacent intermediate levels based on all the 4 pages of data. In second pass 802b, by applying a larger program voltage, the threshold voltages of target memory cells in each level (e.g., in the programmed state) are shifted up to a respective final level (E, L1-1, L1-2, L1-3, ..., or L1-15) with reduced width of the threshold voltage distribution (i.e., a narrower range) based on all the 4 pages of data. The numbers of verify voltages (and corresponding verify processes) in each program/verify loop 804 in each of first and second passes 802*a* and 802*b* are the same, i.e., 15.

Figure 9B:
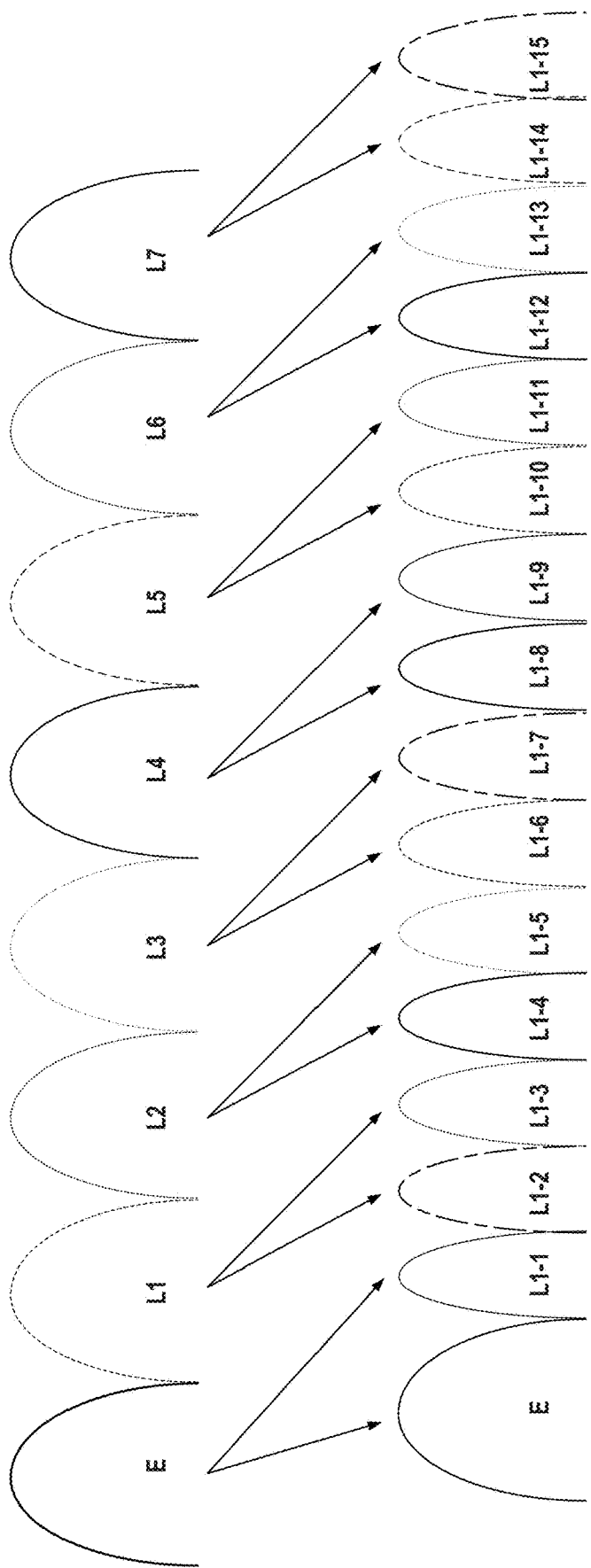
FIG. 9B illustrates threshold voltage distributions of memory cells in another multi-pass program operation.

For $2^{N-1}$-$2^N$ schemes, the number of verify voltages in each program/verify loop 804 in first pass 802*a* is smaller than that in second pass 802*b*, i.e., $2^{N-1}$–1, in order to verify only $2^{N-1}$ possible intermediate levels corresponding to N–1 bits of the N-bits data. Still taking QLCs, where N=4, for example, as shown in FIG. 9B, the target memory cells are first programmed into one of 8 intermediate levels (E, L1, L2, L3, . . . , L7) in first pass 802*a* by applying 7 verify voltages each between two adjacent intermediate levels based on 3 of the 4 pages of data. In second pass 802*b*, by applying a larger program voltage, the threshold voltages of target memory cells in each level (e.g., in the programmed state) are split into and shifted up to two corresponding final levels (E and L1-1, L1-2 and L1-3, . . . , or L1-14 and L1-15) with reduced width of the threshold voltage distribution (i.e., a narrower range) based on all the 4 pages of data. The additional one page of data that is not used in the first pass is used in the second pass to split each intermediate level into two final levels (e.g., splitting L4 into L1-8 and L1-9). The numbers of verify voltages (and corresponding verify processes) in each program/verify loop 804 in each of first and second passes 802*a* and 802*b* are different, i.e., 7 and 15, respectively.

Comparing the different threshold voltage distributions of intermediate levels in FIGS. 9A and 9B, the $2^{N-1}$-$2^N$ schemes can achieve larger read margins than the $2^N$-$2^N$ schemes due to the smaller number of intermediate levels (e.g., 8 vs. 16 for QLCs). As a result, for the $2^{N-1}$-$2^N$ schemes, the N–1 bits of the N-bits data corresponding to each intermediate level may be read from the target memory cells after first pass 802*a* and prior to second pass 802*b*, such that the memory controller may only need to save and transmit the remaining 1 bit of the N-bits data for second pass 802*b*. In contrast, for the $2^N$-$2^N$ schemes, all the N bits of the N-bits data corresponding to each intermediate level may not be read from the target memory cells after first pass 802*a* and thus, the memory controller may need to save and re-transmit all the N bits of the N-bits data for second pass 802*b*.

Figure 12A:
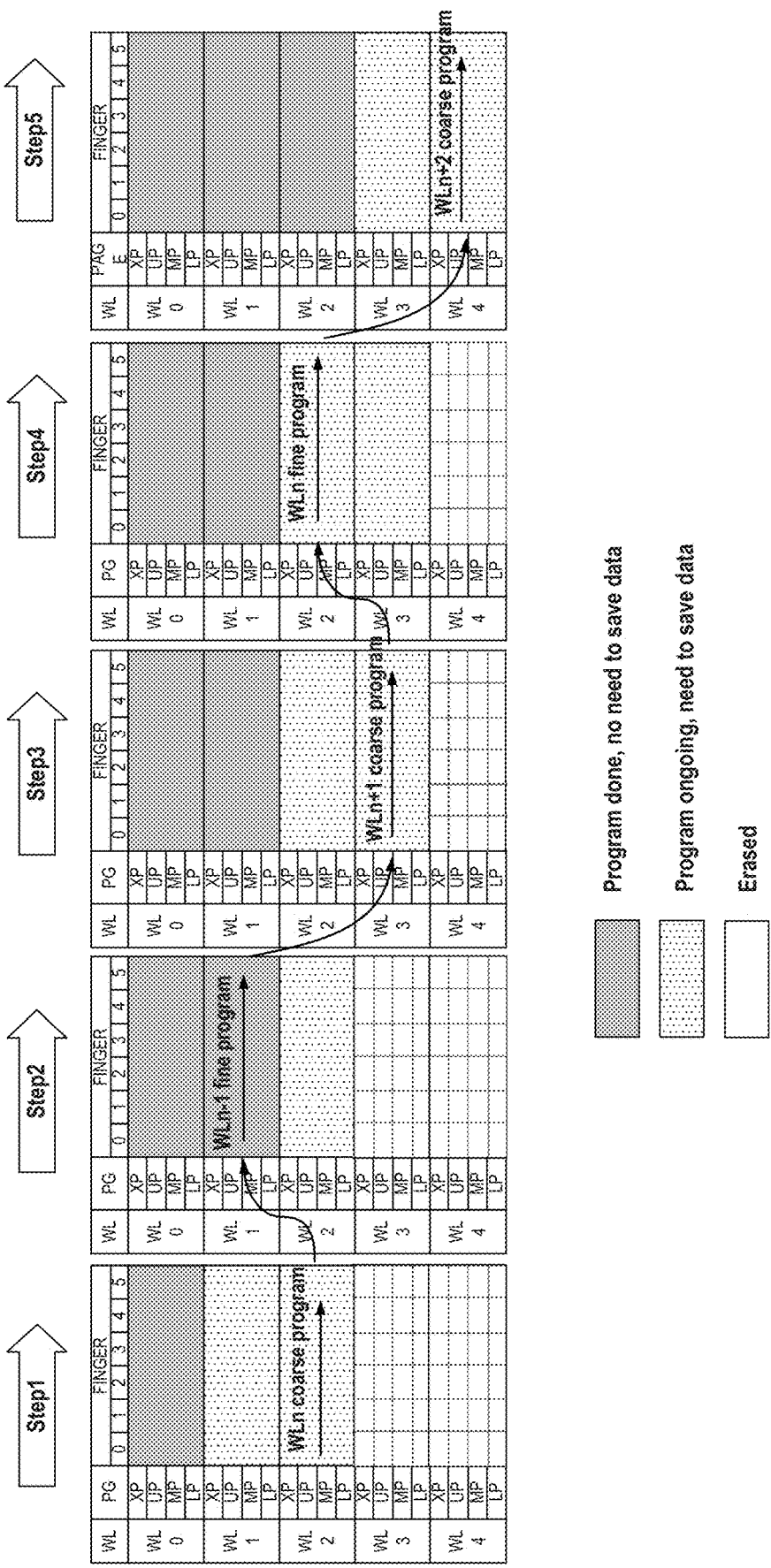
FIG. 12A illustrates a scheme of a multi-pass program operation.

Moreover, to avoid the program disturbance from memory cells in adjacent (e.g., physically and immediately adjacent) rows (i.e., coupling to the adjacent word lines), the multiple program passes applied to the same row of target memory cells may not immediately follow one another. Instead, the multi-pass program schemes may be performed among adjacent rows of memory cells in an interleaved manner. Still taking QLCs, where N=4, for example, as shown in FIG. 12A, word line 2 (WL2) is the current selected word line (WLn) undergoing a coarse program pass in Step 1. After the coarse program pass of WL2, a fine program pass is applied in Step 2 to word line 1 (WL1) that is physically and immediately adjacent to WLn (e.g., WLn–1) to finish the program operation of WL1. Like word line 0 (WL0), the program operation of WL1 is done after Step 2, and the 4 pages of data (XP, UP, MP, and LP) for WL1 no longer need to be saved by the memory controller. After the fine program pass of WL1, a coarse program pass is applied in Step 3 to word line 3 (WL 3) that is physically and immediately adjacent to WLn (e.g., WLn+1). After the coarse program pass of WL3, the program operation returns back to WL2 (WLn) in Step 4 with a fine program pass to finish the operation of WL2. A coarse program pass is then applied to word line 4 (WL4) in Step 5, in which the 4 pages of data (XP, UP, MP, and LP) for WL2 no longer need to be saved by the memory controller. That is, the 4 pages of data (XP, UP, MP, and LP) for WL2 (WLn) need to be saved by the memory controller from Step 1 to Step 4 until the fine program pass is finished. Also, as shown in FIG. 12A, in each step, the maximum loading for the memory controller is the 8 pages of program data for two word lines (e.g., in Steps 1, 3, 4, and 5). As each word line may be coupled with memory cells in 6 fingers each having its own program data, the maximum loading for the memory controller in each step may be 48 pages according to the 16-16 scheme shown in FIG. 12A.

Figure 12B:
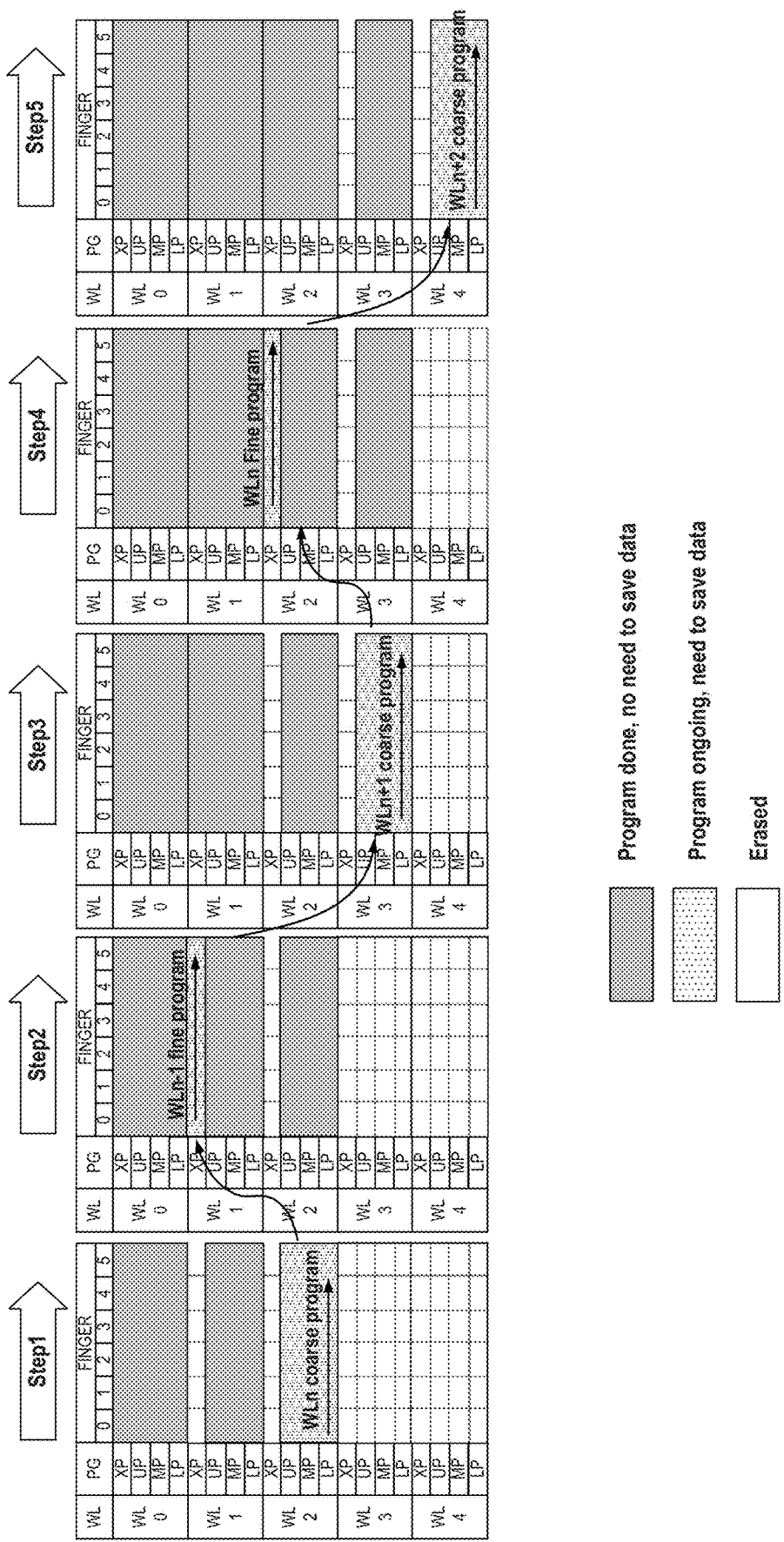
FIG. 12B illustrates a scheme of another multi-pass program operation.

Still taking QLCs, where N=4, for example, as shown in FIG. 12B, word line 2 (WL2) is the current selected word line (WLn) undergoing a coarse program pass in Step 1. For the 8-16 scheme, only 3 pages of data (UP, MP, and LP) need to be saved and used for the coarse program pass in Step 1. After the coarse program pass of WL2, a fine program pass is applied in Step 2 to word line 1 (WL1) that is physically and immediately adjacent to WLn (e.g., WLn–1) to finish the program operation of WL1. For the 8-16 scheme, only one page of data (XP) needs to be saved by the memory controller and used for the fine program pass in Step 2 as the other 3 pages of data (UP, MP, and LP) can be read from the memory device. After the fine program pass of WL1, a coarse program pass is applied in Step 3 to word line 3 (WL 3) that is physically and immediately adjacent to WLn (e.g., WLn+1). Similarly, only 3 pages of data (UP, MP, and LP) need to be saved and used for the coarse program pass in Step 3. After the coarse program pass of WL3, the program operation returns back to WL2 (WLn) in Step 4 with a fine program pass to finish the operation of WL2. For the 8-16 scheme, only one page of data (XP) needs to be saved by the memory controller and used for the fine program pass in Step 4 as the other 3 pages of data (UP, MP, and LP) can be read from the memory device. A coarse program pass is then applied to word line 4 (WL4) in Step 5. That is, the 3 pages of data (UP, MP, and LP) for WL2 (WLn) no longer need to be saved by the memory controller after Step 1, in which the coarse program pass is finished. Also, as shown in FIG. 12B, in each step, the maximum loading for the memory controller is the 3 pages of program data for one word line (e.g., in Steps 1, 3, and 5). As each word line may be coupled with memory cells in 6 fingers each having its own program data, the maximum loading for the memory controller in each step may be 18 pages according to the 8-16 scheme shown in FIG. 12B. As a result, the $2^{N-1}$-$2^N$ schemes can achieve a smaller memory controller loading than the $2^N$-$2^N$ schemes.

On the other hand, the inventors of the present disclosure observe that the threshold voltage distribution of each level does not follow exactly the normal distribution, but instead, has different slopes on different sides of the distribution curve. Specifically, the slope on the left side of the distribution curve (toward the negative voltage direction) is higher than the slope on the right side of the distribution curve (toward the positive voltage direction). The asymmetric shape of the threshold voltage distribution can cause the FBC criteria (margins that can tolerate the fail bits) to vary depending on the number of read levels for each page of data. Still taking QLCs, where N=4, for example, as shown in TABLE 1, for a 16-16 scheme, the number of read levels for pages corresponding to b1, b2, b3, and b4 are 4, 4, 4, and 3, respectively. Conversely, for an 8-16 scheme, since the last page of data has to be able to split each intermediate level into two final levels, the number of read levels for the last page is 8. Accordingly, the FBC criteria (margins) of the $2^{N-1}$-$2^N$ schemes are stricter (smaller) than the FBC criteria (margins) of the $2^N$-$2^N$ schemes due to the characteristics of the additional page of data used by the $2^{N-1}$-$2^N$ schemes in the fine program pass, meaning that the $2^{N-1}$-2N schemes may have a larger FBC than the $2^N$-$2^N$ schemes.

Consistent with the scope of the present disclosure, novel multi-pass program schemes are disclosed below in detail, which balance the pros and cons of the existing $2^N$-$2^N$ schemes and $2^{N-1}$-$2^N$ schemes. For example, FIG. 13 illustrates a flowchart of a method 1300 for operating a memory device, according to some aspects of the present disclosure. The memory device may be any suitable memory device disclosed herein, such as memory device 300. Method 1300 may be implemented by memory controller 106 and peripheral circuit 302, such as row decoder/word line driver 508 and page buffer/sense amplifier 504. FIG. 13 will be described together with FIGS. 3, 4A, 4B, 5A, 5B, 6, 7A, 7B, 10, 11, and 12C. It is understood that the operations shown in method 1300 may not be exhaustive and that other operations can be performed as well before, after, or between any of the illustrated operations. Further, some of the operations may be performed simultaneously, or in a different order than shown in FIG. 13.

Referring to FIG. 13, method 1300 starts at operation 1302, in which a row of target memory cells of the plurality of rows of memory cells is programmed in a first pass thereby programming each of the row of target memory cells into one of K intermediate levels based on one of $2^N$ pieces of N-bits data to be stored in the target memory cell, where N is an integer greater than 1, wherein $2^{N-1}<K<2^N$. In a multi-pass program operation, in a coarse program pass (e.g., any non-last program pass that programs each target memory cell 306 into an intermediate level), each target memory cell 306 is programmed into one of the K levels (where n<N) based on the corresponding N bits of data to be stored in target memory cell 306, according to some implementations. The number of intermediate levels K can be smaller than $2^N$ (i.e., the number of intermediate levels in the existing $2^N$-$2^N$ schemes) such that the K intermediate levels can be sufficiently separated from one another, thereby enabling subsequent reading from target memory cells 306, like the existing $2^{N-1}$-$2^N$ schemes. On the other hand, the number of intermediate levels K can be larger than $2^{N-1}$ (i.e., the number of intermediate levels in the existing $2^{N-1}$-$2^N$ schemes) to soothe the FBC criteria and reduce the FBC compared with the existing $2^{N-1}$-$2^N$ schemes. Still taking QLCs, where N=4, for example, K may be between 8 and 16, such as 12, as described below in detail.

Referring to FIGS. 3, 4A, 4B, 5A, and 5B, each memory cell 306 is configured to store a piece of N-bits data in one of the $2^N$ levels (final levels), where N is an integer greater than 1, according to some implementations. The level can correspond to one of the $2^N$ pieces of N-bits data, such as one value of $2^N$ values of an N-bits gray code. To perform a multi-pass program operation, peripheral circuit 302 can be configured to program, in a first pass (a.k.a., a coarse program pass, e.g., a non-last program pass), a row of target memory cells 306 coupled to a selected word line 318, such that each target memory cell 306 is programmed into one of the K intermediate levels based on the corresponding piece of N-bits data to be stored in target memory cell 306, wherein $2^{N-1}<K<2^N$. In some implementations, memory controller 106 is configured to, for each target memory cell 306, transmit the corresponding piece of N-bits data through interface 530 to page buffer/sense amplifier 504 prior to the first pass. Still taking QLCs, where N=4, for example, as shown in FIG. 7A, 4 storage modules 702 (P1, P2, P3, and P4) of page buffer/sense amplifier 504 are configured to temporarily store one of 4 pages of 4-bits data, respectively, in the first pass. For each target memory cell 306, the 4 bits of binary values in the corresponding piece of 4-bits data (e.g., b1, b2, b3, and b4 according to the gray code in TABLE 1) may be temporarily stored in the corresponding set of 4 storage units 704, respectively.

Figure 14:
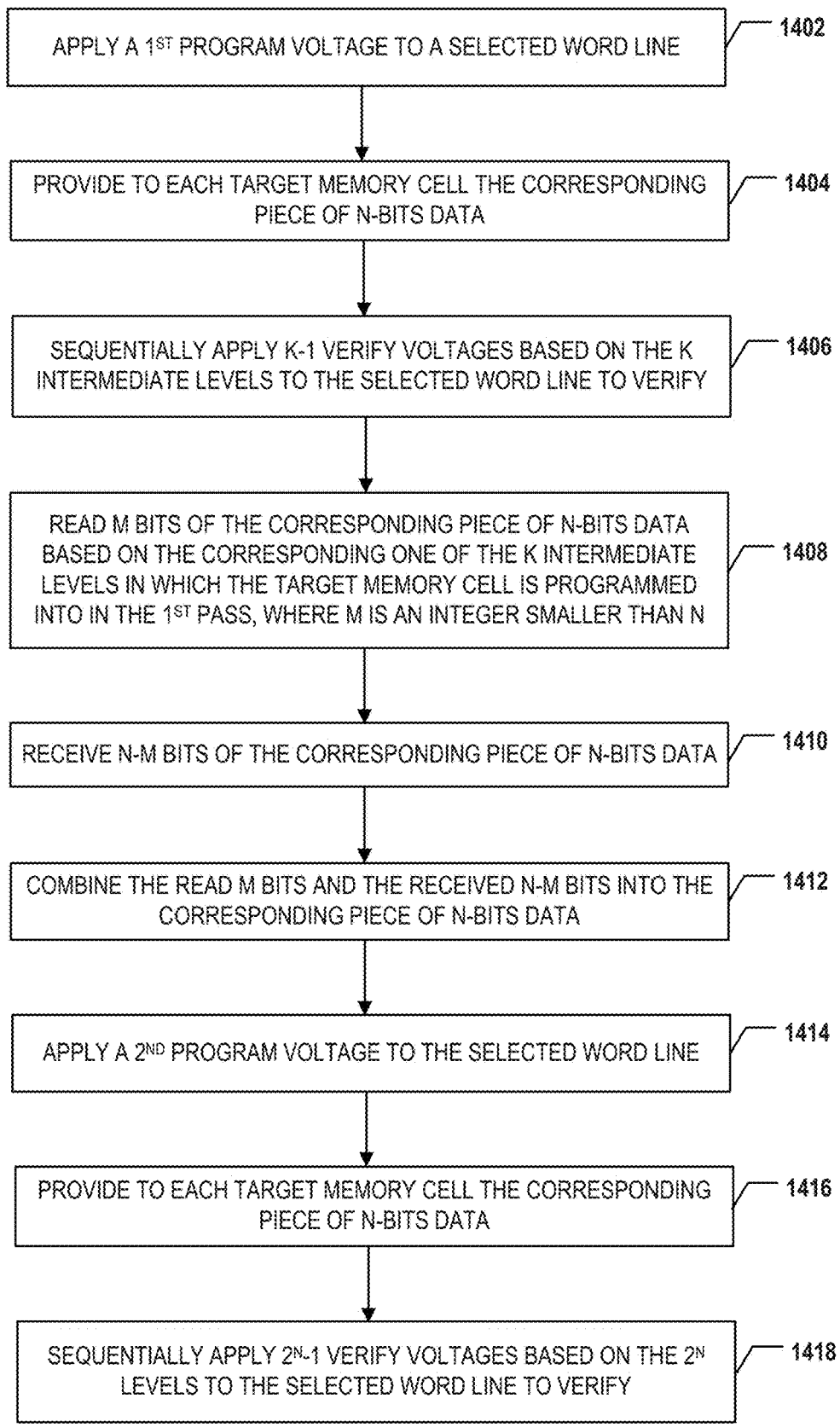
FIG. 14 illustrates a flowchart of another exemplary method for operating a memory device, according to some aspects of the present disclosure.

Referring to FIG. 14, in some implementations, in the first pass, at operation 1402, a first program voltage is applied to a first selected word line of the word lines. The first selected word line can be coupled to the first row of target memory cells. At operation 1404, the corresponding piece of N-bits data is provided to each target memory cell.

For example, FIG. 10 illustrates an exemplary waveform of word line voltages applied to a selected word line in a multi-pass program operation, according to some aspects of the present disclosure. In some implementations, to program the row of target memory cells 306 in a first pass 1001, row decoder/word line driver 508 is configured to apply a first program voltage Vpgm 1 to a selected word line 318 in each program/verify loop 1002. It is understood that first pass 1001 may include one or more program/verify loops 1002 having different first program voltages Vpgm 1, for example, using the incremental step pulse programming (ISPP) scheme. For ease of description, only one program/verify loop 1002 is illustrated in FIG. 10. To program the row of target memory cells 306 in first pass 1001, page buffer/sense amplifier 504 is configured to provide to each target memory cell 306 the corresponding piece of N-bits data (e.g., one value of $2^N$ values of an N-bits gray code), according to some implementations. For example, when N=4, as shown in FIG. 7A, for each QLC under coarse programming, page buffer/sense amplifier 504 may provide a corresponding piece of 4-bits data (e.g., a 4-bit gray code b1b2b3b4 in TABLE 2) from the respective set of 4 storage units 704 in each of 4 storage modules 702.

Figure 11:
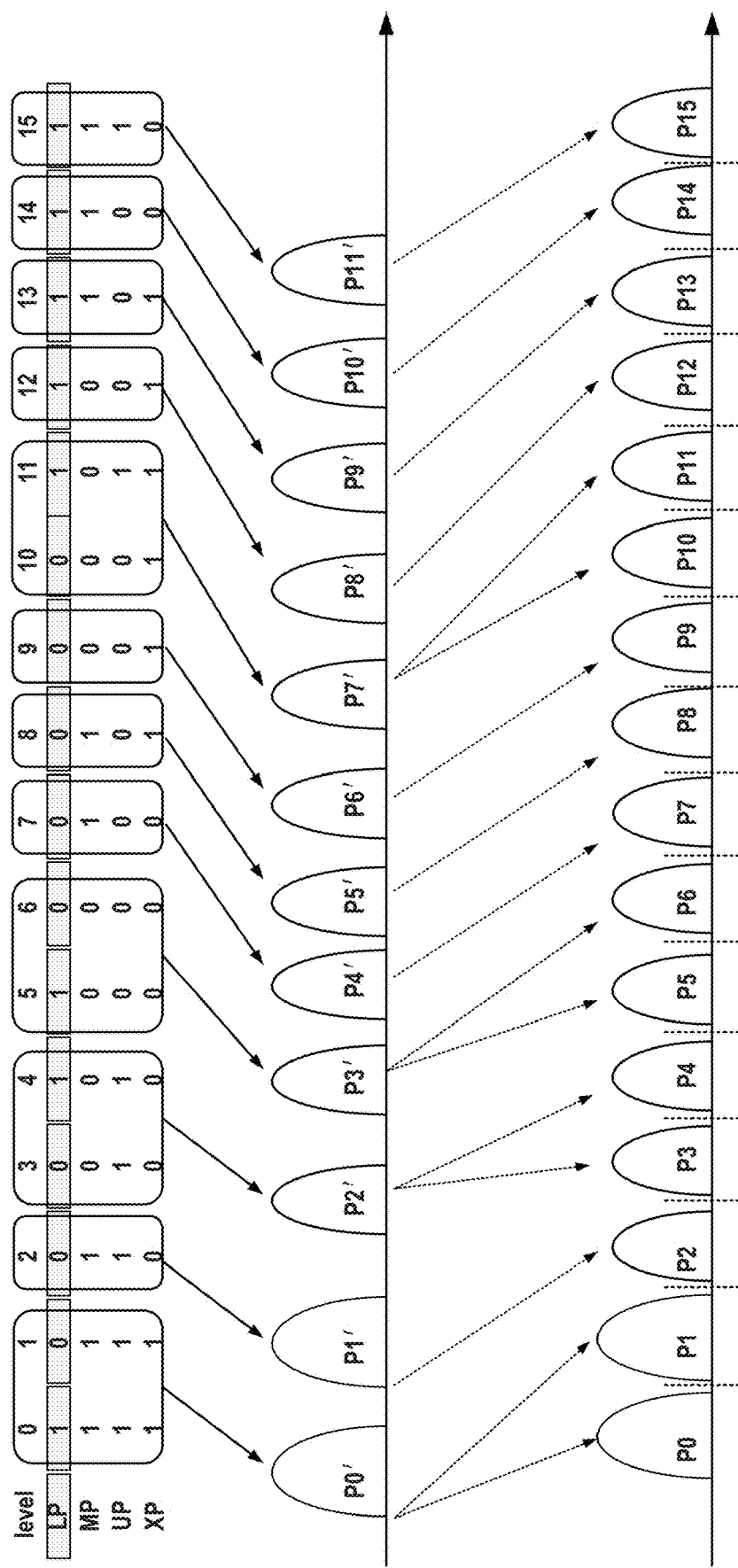
FIG. 11 illustrates exemplary threshold voltage distributions of memory cells in a multi-pass program operation, according to some aspects of the present disclosure.

Referring back to FIG. 14, in some implementations, in the first pass, at operation 1406, K−1 verify voltages based on the K intermediate levels are sequentially applied to the first selected word line. The K intermediate levels can thus be programmed by the K−1 verify voltages. At least a first one of the K intermediate levels can correspond to a plurality of the $2^N$ pieces of N-bits data, and at least a second one of the K intermediate levels can correspond to one of the $2^N$ pieces of N-bits data. In some implementations, the first intermediate level corresponds to two of the $2^N$ pieces of N-bits data (two values of a gray code). That is, some pieces of the $2^N$ pieces of N-bits data can be combined to correspond to the same intermediate level (i.e., forming a multiple-to-one mapping) to reduce the total number of intermediate levels from $2^N$. On the other hand, at least one piece of the $2^N$ pieces of N-bits data (one value of a gray code) can still correspond to one intermediate level (i.e., forming a one-to-one mapping) to cause the total number of intermediate levels to be greater than $2^{N-1}$. Still taking QLCs, where N=4, for example, as shown in FIG. 11, the pair of the two pieces of 4-bits data for final levels 0 and 1 are combined and correspond to intermediate level P0', the pair of the two pieces of 4-bits data for final levels 3 and 4 are combined and correspond to intermediate level P2', the pair of the two pieces of 4-bits data for final levels 5 and 6 are combined and correspond to intermediate level P3', and the pair of the two pieces of 4-bits data for final levels 10 and 11 are combined and correspond to intermediate level P7'. Conversely, the remaining pieces of 4-bit data for final level 2, 7, 8, 9, 12, 13, 14, and 15 still correspond to intermediate level P1', P4', P5', P6', P8', P9', P10', and P11', respectively. As a result, 12 intermediate levels can be programmed based on 16 pieces of 4-bits data.

In some implementations, the two pieces of N-bits data that are combined and correspond to the same intermediate level have the same M bits, where M is an integer smaller than N. For example, N−M=1. That is, two pieces of N-bits data (two values of a gray code) that share most of the N bits, except for one bit, may correspond to the same intermediate level. As shown in the example of FIG. 11, for each pair of the two pieces of 4-bits data combined into a single intermediate level, the 3 bits in MP, UP, and XP (corresponding to b2b3b4 in TABLE 1) are the same, while the bit in LP is different. For example, the pair of the two pieces of 4-bits data for final levels 5 and 6 may have the same 000 bits in MP, UP, and XP, but a different bit 1 or 0 in LP. As described below in detail, the different bits of the two pieces of N-bits data need to be saved and re-transmitted by memory controller 106 to page buffer/sense amplifier 504 after first pass 1001 in order to separate the combined intermediate level into two final levels. Nevertheless, in first pass 1001, for each pair of the two pieces of N-bits data that are combined and correspond to the same intermediate level, although all N bits of data may be temporally stored and provided by page buffer/sense amplifier 504, only M of the N bits may be used to program the corresponding target memory cells 306. In contrast, in first pass 1001, for each piece of N-bits data (each value of a gray code) that is not combined, all N bits may be used to program the corresponding target memory cells 306. It is understood that the example shown in FIG. 11 is for illustrative purposes only. By varying the gray codes and/or the difference between N and M, the number and arrangement of intermediate levels may vary as well. Nevertheless, the number K of intermediate level may still satisfy the limitation that $2^{N-1}<K<2^N$ by applying the scheme disclosed above, which changes the one-to-one mapping to the mixed one-to-one mapping/multiple-to-one mapping between values of a gray code and the intermediate levels.

As shown in FIG. 11, to verify target memory cells 306 in K intermediate levels, K−1 verify voltages can be used. For example, 11 verify voltages may be used to verify target memory cells 306 in 12 intermediate levels (N=4, and K=12. Row decoder/word line driver 508 can be configured to sequentially apply the K−1 verify voltages (Vvf) to selected word line 318. In some implementations, each of the K−1 verify voltages is between two adjacent intermediate levels of the K intermediate levels. For example, when N=4, as shown in FIG. 11, for each QLC undergoing coarse programming, only 11 verify voltages each between two adjacent intermediate levels may be needed to verify target memory cells 306 in one of 12 intermediate levels. In some implementations, target memory cells 306 corresponding to different values of the gray code, but in the same intermediate level (e.g., P0', P2', P3', or P7'), are verified under the same condition.

Method 1300 proceeds to operation 1304, as illustrated in FIG. 13, in which another row of target memory cells of the plurality of rows of memory cells is programmed in a last pass. The another row of target memory cells can be adjacent to the row of target memory cells. In some implementations, the another row of target memory cells is physically and immediately adjacent to the row of target memory cells. The interleaved programming manner among adjacent word lines as described above in FIGS. 12A and 12B may be similarly applied in the example in FIG. 12C.

Figure 12C:
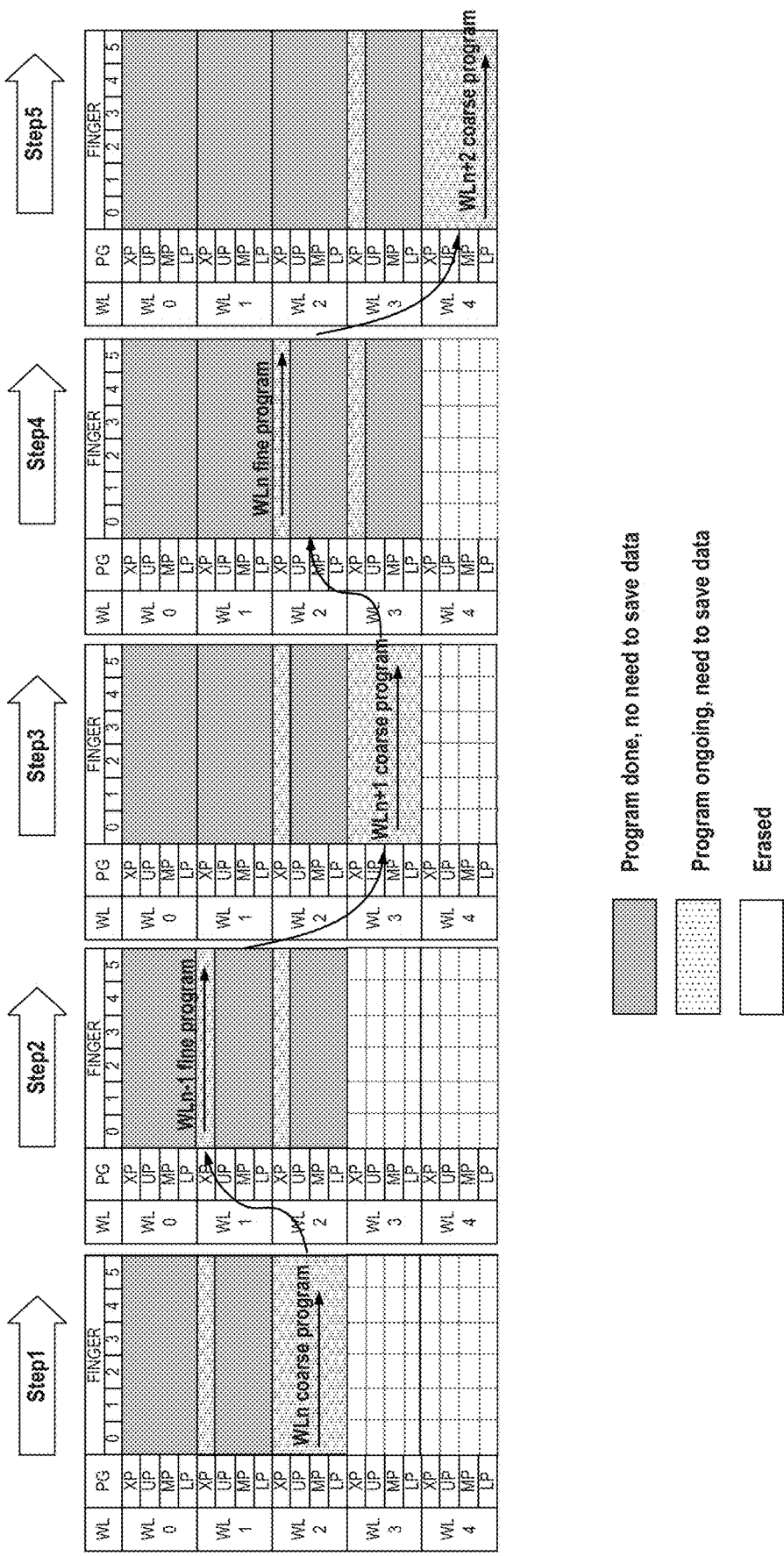
FIG. 12C illustrates a scheme of an exemplary multi-pass program operation, according to some aspects of the present disclosure.
Figure 13:
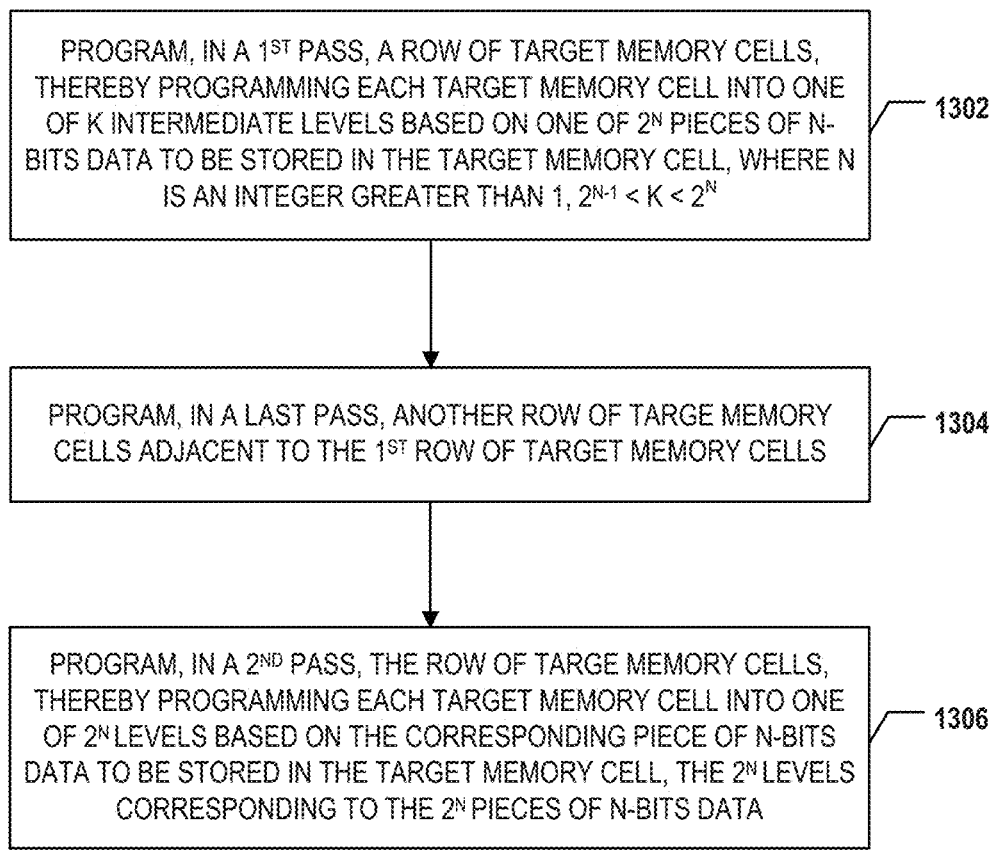
FIG. 13 illustrates a flowchart of an exemplary method for operating a memory device, according to some aspects of the present disclosure.

Still taking QLCs, where N=4, for example, as shown in FIG. 12C, word line 2 (WL2) is the current selected word line (WLn) undergoing a coarse program pass in Step 1. For the multi-pass program scheme disclosed herein, all 4 pages of data (XP, UP, MP, and LP) need to be saved and used for the coarse program pass in Step 1. After the coarse program pass of WL2, a fine program pass (e.g., the last pass) is applied in Step 2 to word line 1 (WL1) that is physically and immediately adjacent to WLn (e.g., WLn−1) to finish the program operation of WL1. For the multi-pass program scheme disclosed herein, only one page of data (XP) needs to be saved by the memory controller and used for the fine program pass of WL1 in Step 2 as the other 3 pages of data (UP, MP, and LP) can be read from the memory device. In Step 2, one page of data (XP) needs to be saved by the memory controller for WL2 as well as such a page of data needs to be re-transmitted again for the fine program pass of WL2. After the fine program pass of WL1, a coarse program pass is applied in Step 3 to word line 3 (WL 3) that is physically and immediately adjacent to WLn (e.g., WLn+1). Similarly, all 4 pages of data (XP, UP, MP, and LP) need to be saved and used for the coarse program pass of WL 3 in Step 3. In Step 3, the one page of data (XP) still needs to be saved by the memory controller for WL2. After the coarse program pass of WL3, the program operation returns back to WL2 (WLn) in Step 4 with a fine program pass to finish the operation of WL2. For the multi-pass program scheme disclosed herein, only one page of data (XP) needs to be saved by the memory controller and re-transmitted for the fine program pass in Step 4 as the other 3 pages of data (UP, MP, and LP) can be read from the memory device. A coarse program pass is then applied to word line 4 (WL4) in Step 5. That is, only one page of data (XP) needs to be saved by the memory controller between the coarse and fine program passes in Steps 2, 3, and 4. Also, as shown in FIG. 12C, in each step, the maximum loading for the memory controller is the 4 pages of program data for one word line plus one page of program data for another word line (e.g., in Steps 1, 3, and 5). As each word line may be coupled with memory cells in 6 fingers each having its own program data, the maximum loading for the memory controller in each step may be 30 pages according to the multi-pass program scheme shown in FIG. 12C. As a result, the multi-pass program scheme disclosed herein can achieve a smaller memory controller loading than the $2^N$-$2^N$ schemes. Moreover, the interleaved programming manner among adjacent word lines can ensure that the fine program pass (e.g., the last pass) of the current selected word line 318 (WLn) occurs after the fine program pass of WLn−1 such that any program disturbance to WLn by the adjacent word line (WLn−1) can be compensated by the fine program pass of WLn.

Method 1300 proceeds to operation 1306, as illustrated in FIG. 13, in which the row of target memory cells is programmed in a second pass after the first pass, thereby programming each target memory cell into one of $2^N$ levels based on the corresponding piece of N-bits data to be stored in the target memory cell. The $2^N$ levels can correspond to the $2^N$ pieces of N-bits data.

In the multi-pass program operation, in the fine program pass (e.g., the last program pass that programs each target memory cell 306 into a final level), each target memory cell 306 can be programmed into one of the $2^N$ levels based on the corresponding N bits of data to be stored in target memory cell 306. To perform the multi-pass program operation, peripheral circuit 302 can be further configured to program, in a second pass (a.k.a., a fine program pass, e.g., the last program pass), the row of target memory cells 306, such that each target memory cell 306 is programmed into one of the $2^N$ levels (final levels) based on the corresponding piece of N-bits data to be stored in target memory cell 306. The level (final level) can correspond to one of $2^N$ threshold voltage ranges (final threshold voltage ranges) of target memory cells 306. Some threshold voltage ranges of target memory cells 306 in a same intermediate level that combines multiple values of a gray code in the first pass can now be shifted up and split into different final threshold voltage ranges by the second pass. Other threshold voltage ranges of target memory cells 306 can now be shifted up to final threshold voltage ranges by the second pass. Still taking QLCs, where N=4, for example, as shown in FIG. 11, each of intermediate levels P0', P2', P3' and P7' may be shifted up and split into two adjacent final levels by the fine program pass, while each of intermediate levels P1', P4', P5', P6', P8', P9', P10', and P11' may be shifted up into a respective final level, such that the number of levels may be increased from 12 intermediate levels to 16 final levels.

Different from the existing $2^N$-$2^N$ schemes in which the entire N pages of data need to be re-transmitted from the memory controller again, according to the multi-pass program scheme disclosed herein, M pages of the N pages of data can be read from the row of target memory cells based on the corresponding intermediate levels, such that only the remaining N–M pages of data need to be re-transmitted from the memory controller again for the fine program pass. Referring to FIG. 14, in some implementations, prior to the second, at operation 1408, for each target memory cell, M bits of the corresponding piece of N-bits data is read based on the corresponding one of the K intermediate levels in which the target memory cell is programmed into in the first pass, where M is an integer smaller than N. For example, a read operation may be performed to read M pages of data from the row of target memory cells. At operation 1410, for each target memory cell, N–M bits of the corresponding piece of N-bits data is received. At operation 1412, for each target memory cell, the read M bits and the received N–M bits are combined into the corresponding piece of N-bits data. At operation 1414, the corresponding piece of N-bits data is provided to the target memory cell.

In some implementations, memory controller 106 is also configured to, for each target memory cell 306, store N–M bits of the corresponding piece of N-bits data, for example, in cache 524, after the first pass. In some implementations, memory controller 106 is further configured to, for each target memory cell 306, transmit the stored N–M bits of the corresponding piece of N-bits data through interface 530 to page buffer/sense amplifier 504 prior to the second pass. Still taking QLCs, where N=4, for example, as shown in FIG. 7B, 3 storage modules 702 (P1, P2, and P3) of page buffer/sense amplifier 504 are configured to temporarily store 3 pages of the 4 pages of data, respectively, which are read from the row of target memory cells by a read operation prior to the second pass. For each target memory cell 306, 3 bits of binary values in the corresponding piece of 4-bits data (e.g., b2, b3, and b4 according to the gray code in TABLE 1) may be read from each respective target memory cell 306 and temporarily stored the corresponding set of 3 storage units 704, respectively. For example, as shown in FIG. 11, 3 pages (MP, UP, and XP) may be read based on 12 intermediate levels. Since the remaining page (LP) may not be used in some intermediate levels that are combined from two values of a gray code (e.g., P0', P2', P3' and P7'), the remaining page (LP) may not be read based on the intermediate levels. As shown in FIG. 3B, the remaining storage module 702 (P4) of page buffer/sense amplifier 504 is configured to receive the remaining page of the 4 pages of data from memory controller 106 and temporarily store the remaining page of data prior to the second pass. For each target memory cell 306, 1 bit of binary value in the corresponding piece of 4-bits data (e.g., b1 according to the gray code in TABLE 1) may be received from memory controller 106 and temporarily stored the corresponding set of storage units 704, respectively. For example, as shown in FIG. 11, the remaining page (LP) may be received from memory controller 106.

As shown in FIG. 7B, page buffer/sense amplifier 504 can be further configured to, for each target memory cell 306, combine the read 3 bits of binary values in the corresponding piece of 4-bits data (e.g., b2, b3, and b4 according to the gray code in TABLE 1) and the received 1 bit of binary value in the corresponding piece of 4-bits data (e.g., b1 according to the gray code in TABLE 1) into the corresponding piece of 4-bits data. Page buffer/sense amplifier 504 can be further configured to, for each target memory cell 306, provide the corresponding piece of 4-bits data for the second pass.

Referring to FIG. 14, in some implementations, in the second pass, at operation 1414, a second program voltage is applied to the first selected word line. At operation 1416, the corresponding piece of N-bits data is provided to each target memory cell. For example, as shown in FIG. 10, to program the row of target memory cells 306 in a second pass 1003, row decoder/word line driver 508 is configured to apply a second program voltage Vpgm 2 to selected word line 318 in each program/verify loop 1004. It is understood that second pass 1003 may also include one or more program/verify loops 1004 having different second program voltages Vpgm 2, for example, using the ISPP scheme as well. For ease of description, only one program/verify loop 1004 is illustrated in FIG. 10. The second program voltage Vpgm 2 can be higher than the first program voltage Vpgm 1 in order to shift the threshold voltage distributions up as described above. To program the row of target memory cells 306 in second pass 1003, page buffer/sense amplifier 504 is configured to provide to each target memory cell 306 the corresponding piece of N-bits data (e.g., one value of $2^N$ values of an N-bits gray code), according to some implementations. For example, when N=4, as shown in FIG. 7B, for each QLC under coarse programming, page buffer/sense amplifier 504 may provide a corresponding piece of 4-bits data (e.g., a 4-bit gray code b1b2b3b4 in TABLE 1) from the respective set of 4 storage units 704 in each of 4 storage modules 702.

Referring back to FIG. 14, in some implementations, in the second pass, at operation 1418, $2^N$–1 verify voltages based on the $2^N$ levels are sequentially applied to the first selected word line. As shown in FIG. 10, in some implementations, to program the row of target memory cells 306 in second pass 1003, row decoder/word line driver 508 is configured to verify the row of target memory cells 306 using $2^N$–1 verify voltages based on the $2^N$ levels (final levels). To verify target memory cells 306 in $2^N$ final levels, $2^N$–1 verify voltages can be used. For example, 15 verify voltages may be used to verify target memory cells 306 in 16 final levels (N=4). As shown in FIG. 10, to verify the row of target memory cells 306, row decoder/word line driver 508 can be configured to sequentially apply the $2^N$–1 verify voltages (Vvf) to selected word line 318. In some implementations, each of the $2^N$–1 verify voltages is between two adjacent final levels of the $2^N$ final levels. For example, when N=4, as shown in FIG. 11, for each QLC undergoing fine programming, 15 verify voltages each between two adjacent final levels may be needed to verify target memory cells 306 in one of 16 final levels.

According to one aspect of the present disclosure, a memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1} < K < 2^N$. The peripheral circuit is also configured to program, in a second pass after the first pass, the row of target memory cells, such that each target memory cell is programmed into one of the $2^N$ levels based on the corresponding piece of N-bits data to be stored in the target memory cell.

In some implementations, the peripheral circuit includes a page buffer configured to, prior to the second pass, for each target memory cell, read M bits of the corresponding piece of N-bits data based on the corresponding one of the K intermediate levels in which the target memory cell is programmed into in the first pass, where M is an integer smaller than N, and receive N−M bits of the corresponding piece of N-bits data.

In some implementations, the page buffer is further configured to combine the read M bits and the received N−M bits into the corresponding piece of N-bits data, and provide the corresponding piece of N-bits data to the target memory cell.

In some implementations, at least a first one of the K intermediate levels corresponds to a plurality of the $2^N$ pieces of N-bits data, and at least a second one of the K intermediate levels corresponds to one of the $2^N$ pieces of N-bits data.

In some implementations, the first intermediate level corresponds to two of the $2^N$ pieces of N-bits data.

In some implementations, the two pieces of N-bits data have same M bits.

In some implementations, N−M=1.

In some implementations, the peripheral circuit includes a word line driver configured to, in the first pass, apply a first program voltage to a selected word line of the word lines, the selected word line being coupled to the row of target memory cells, and sequentially apply K−1 verify voltages based on the K intermediate levels to the selected word line.

In some implementations, the word line driver is further configured to, in the second pass, apply a second program voltage to the selected word line, and sequentially apply $2^{N-1}$ verify voltages based on the $2^1$ levels to the selected word line.

In some implementations, the peripheral circuit is further configured to, between the first pass and the second pass of programming the row of target memory cells, program, in a last pass, another row of target memory cells of the plurality of rows of memory cells. In some implementations, the another row of target memory cells is adjacent to the row of target memory cells.

In some implementations, N=4, and the memory device includes a 3D NAND Flash memory device.

According to another aspect of the present disclosure, a system includes a memory device configured to store data and a memory controller coupled to the memory device. The memory device includes a memory cell array having a plurality of rows of memory cells, a plurality of word lines respectively coupled to the plurality rows of memory cells, and a peripheral circuit coupled to the memory cell array through the word lines. Each memory cell is configured to store a piece of N-bits data in one of $2^N$ levels, where N is an integer greater than 1. The level corresponds to one of $2^N$ pieces of N-bits data. The peripheral circuit is configured to program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1} < K < 2^N$. The peripheral circuit is also configured to program, in a second pass after the first pass, the row of target memory cells, such that each target memory cell is programmed into one of the $2^N$ levels based on the corresponding piece of N-bits data to be stored in the target memory cell. The memory controller is configured to transmit the corresponding piece of N-bits data to the peripheral circuit prior to the first pass, store N−M bits of the corresponding piece of N-bits data after the first pass, where M is an integer smaller than N, and transmit the stored N−M bits of the corresponding piece of N-bits data to the peripheral circuit prior to the second pass.

In some implementations, the peripheral circuit includes a page buffer configured to, prior to the second pass, for each target memory cell, read M bits of the corresponding piece of N-bits data based on the corresponding one of the K intermediate levels in which the target memory cell is programmed into in the first pass, where M is an integer smaller than N, and receive the N−M bits of the corresponding piece of N-bits data from the memory controller.

In some implementations, the page buffer is further configured to combine the read M bits and the received N−M bits into the corresponding piece of N-bits data, and provide the corresponding piece of N-bits data to the target memory cell.

In some implementations, at least a first one of the K intermediate levels corresponds to a plurality of the $2^N$ pieces of N-bits data, and at least a second one of the K intermediate levels corresponds to one of the $2^N$ pieces of N-bits data.

In some implementations, the first intermediate level corresponds to two of the $2^N$ pieces of N-bits data.

In some implementations, the two pieces of N-bits data have same M bits.

In some implementations, N−M=1.

In some implementations, the peripheral circuit includes a word line driver configured to, in the first pass, apply a first program voltage to a selected word line of the word lines, the selected word line being coupled to the row of target memory cells, and sequentially apply K−1 verify voltages based on the K intermediate levels to the selected word line.

In some implementations, the word line driver is further configured to, in the second pass, apply a second program voltage to the selected word line, and sequentially apply $2^N-1$ verify voltages based on the $2^N$ levels to the selected word line.

In some implementations, the peripheral circuit is further configured to, between the first pass and the second pass of programming the row of target memory cells, program, in a last pass, another row of target memory cells of the plurality of rows of memory cells. In some implementations, the another row of target memory cells is adjacent to the row of target memory cells.

According to still another aspect of the present disclosure, a method for operating a memory device is provided. The memory device includes a memory cell array having a plurality of rows of memory cells, and a plurality of word lines respectively coupled to the plurality rows of memory cells. In a first pass, a row of target memory cells of the plurality of rows of memory cells is programmed, such that each of the row of target memory cells is programmed into one of K intermediate levels based on one of $2^N$ pieces of N-bits data to be stored in the target memory cell, where N is an integer greater than 1, wherein $2^{N-1}<K<2^N$. In a second pass after the first pass, the row of target memory cells is programmed, such that each target memory cell is programmed into one of $2^N$ levels based on the corresponding piece of N-bits data to be stored in the target memory cell. The $2^N$ levels correspond to the $2^N$ pieces of N-bits data.

In some implementations, prior to the second pass, for each target memory cell, M bits of the corresponding piece of N-bits data are read based on the corresponding one of the K intermediate levels in which the target memory cell is programmed into in the first pass, where M is an integer smaller than N, and N−M bits of the corresponding piece of N-bits data are received.

In some implementations, the read M bits and the received N−M bits are combined into the corresponding piece of N-bits data, and the corresponding piece of N-bits data is provided to the target memory cell.

In some implementations, at least a first one of the K intermediate levels corresponds to a plurality of the $2^N$ pieces of N-bits data, and at least a second one of the K intermediate levels corresponds to one of the $2^N$ pieces of N-bits data.

In some implementations, the first intermediate level corresponds to two of the $2^N$ pieces of N-bits data.

In some implementations, the two pieces of N-bits data have same M bits.

In some implementations, N−M=1.

In some implementations, to program the row of target memory cells in the first pass, a first program voltage is applied to a selected word line of the word lines, the selected word line being coupled to the row of target memory cells, and K−1 verify voltages based on the K intermediate levels are sequentially applied to the selected word line.

In some implementations, to program the row of target memory cells in the second pass, a second program voltage is applied to the selected word line, and $2^N-1$ verify voltages based on the $2^N$ levels are sequentially applied to the selected word line.

In some implementations, between the first pass and the second pass of programming the row of target memory cells, another row of target memory cells of the plurality of rows of memory cells is programmed in a last pass. In some implementations, the another row of target memory cells is adjacent to the row of target memory cells.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
    a memory cell array having a plurality of rows of memory cells, each memory cell being configured to store a piece of N-bits data in one of $2^N$ levels, the level corresponding to one of $2^N$ pieces of N-bits data, where N is an integer greater than 1;
    a plurality of word lines respectively coupled to the plurality rows of memory cells; and
    a peripheral circuit coupled to the memory cell array through the word lines and configured to:
        program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1}<K<2^N$; and
        program, in a second pass after the first pass, the row of target memory cells, such that each target memory cell is programmed into one of the $2^N$ levels based on the corresponding piece of N-bits data to be stored in the target memory cell.

2. The memory device of claim 1, wherein the peripheral circuit comprises a page buffer configured to, prior to the second pass, for each target memory cell:
    read M bits of the corresponding piece of N-bits data based on the corresponding one of the K intermediate levels in which the target memory cell is programmed into in the first pass, where M is an integer smaller than N; and
    receive N−M bits of the corresponding piece of N-bits data.

3. The memory device of claim 2, wherein the page buffer is further configured to:
    combine the read M bits and the received N−M bits into the corresponding piece of N-bits data; and
    provide the corresponding piece of N-bits data to the target memory cell.

4. The memory device of claim 2, wherein at least a first one of the K intermediate levels corresponds to a plurality of the $2^N$ pieces of N-bits data, and at least a second one of the K intermediate levels corresponds to one of the $2^N$ pieces of N-bits data.

5. The memory device of claim 4, wherein the first intermediate level corresponds to two of the $2^N$ pieces of N-bits data.

6. The memory device of claim 5, wherein the two pieces of N-bits data have same M bits.

7. The memory device of claim 2, wherein N−M=1.

8. The memory device of claim 1, wherein the peripheral circuit comprises a word line driver configured to, in the first pass:
    apply a first program voltage to a selected word line of the word lines, the selected word line being coupled to the row of target memory cells; and
    sequentially apply K−1 verify voltages based on the K intermediate levels to the selected word line.

9. The memory device of claim 8, wherein the word line driver is further configured to, in the second pass:
    apply a second program voltage to the selected word line; and
    sequentially apply $2^N-1$ verify voltages based on the $2^N$ levels to the selected word line.

10. The memory device of claim 1, wherein the peripheral circuit is further configured to, between the first pass and the second pass of programming the row of target memory cells, program, in a last pass, another row of target memory cells of the plurality of rows of memory cells, the another row of target memory cells being adjacent to the row of target memory cells.

11. The memory device of claim 1, wherein N=4, and the memory device includes a three-dimensional (3D) NAND Flash memory device.

12. A system, comprising:
    a memory device configured to store data, the memory device comprising:

a memory cell array having a plurality of rows of memory cells, each memory cell being configured to store a piece of N-bits data in one of $2^N$ levels, the level corresponding to one of $2^N$ pieces of N-bits data, where N is an integer greater than 1;

a plurality of word lines respectively coupled to the plurality rows of memory cells; and a peripheral circuit coupled to the memory cell array through the word lines and configured to:

program, in a first pass, a row of target memory cells of the plurality of rows of memory cells, such that each of the row of target memory cells is programmed into one of K intermediate levels based on the corresponding piece of N-bits data to be stored in the target memory cell, wherein $2^{N-1}<K<2^N$; and program, in a second pass after the first pass, the row of target memory cells, such that each target memory cell is programmed into one of the $2^N$ levels based on the corresponding piece of N-bits data to be stored in the target memory cell; and a memory controller coupled to the memory device and configured to, for each target memory cell:

transmit the corresponding piece of N-bits data to the peripheral circuit prior to the first pass;

store N−M bits of the corresponding piece of N-bits data after the first pass, where M is an integer smaller than N; and transmit the stored N−M bits of the corresponding piece of N-bits data to the peripheral circuit prior to the second pass.

13. A method for operating a memory device, the memory device comprising a memory cell array having a plurality of rows of memory cells, and a plurality of word lines respectively coupled to the plurality rows of memory cells, the method comprising:

programming, in a first pass, a row of target memory cells of the plurality of rows of memory cells, thereby programming each of the row of target memory cells into one of K intermediate levels based on one of $2^N$ pieces of N-bits data to be stored in the target memory cell, where N is an integer greater than 1, wherein $2^{N-1}<K<2^N$; and programming, in a second pass after the first pass, the row of target memory cells, thereby programming each target memory cell into one of $2^N$ levels based on the corresponding piece of N-bits data to be stored in the target memory cell, the $2^N$ levels corresponding to the $2^N$ pieces of N-bits data.

14. The method of claim 13, further comprising, prior to the second pass, for each target memory cell:

reading M bits of the corresponding piece of N-bits data based on the corresponding one of the K intermediate levels in which the target memory cell is programmed into in the first pass, where M is an integer smaller than N; and receiving N−M bits of the corresponding piece of N-bits data.

15. The method of claim 14, further comprising:

combining the read M bits and the received N−M bits into the corresponding piece of N-bits data; and providing the corresponding piece of N-bits data to the target memory cell.

16. The method of claim 14, wherein at least a first one of the K intermediate levels corresponds to a plurality of the $2^N$ pieces of N-bits data, and at least a second one of the K intermediate levels corresponds to one of the $2^N$ pieces of N-bits data.

17. The method of claim 16, wherein the first intermediate level corresponds to two of the $2^N$ pieces of N-bits data.

18. The method of claim 17, wherein the two pieces of N-bits data have same M bits.

19. The method of claim 14, wherein N−M=1.

20. The method of claim 13, wherein programming the row of target memory cells in the first pass comprises:

applying a first program voltage to a selected word line of the word lines, the selected word line being coupled to the row of target memory cells; and sequentially applying K−1 verify voltages based on the K intermediate levels to the selected word line.

* * * * *